(12) United States Patent
Valcore, Jr. et al.

(10) Patent No.: US 9,320,127 B2
(45) Date of Patent: Apr. 19, 2016

(54) TUNING A PARAMETER ASSOCIATED WITH PLASMA IMPEDANCE

(71) Applicant: Lam Research Corporation, Fremont, CA (US)

(72) Inventors: John C. Valcore, Jr., Fremont, CA (US); Bradford J. Lyndaker, San Ramon, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/673,567

(22) Filed: Mar. 30, 2015

(65) Prior Publication Data

US 2015/0206717 A1   Jul. 23, 2015

Related U.S. Application Data

(62) Division of application No. 13/740,047, filed on Jan. 11, 2013, now Pat. No. 9,155,182.

(51) Int. Cl.
*H05H 1/46* (2006.01)
*H01J 37/32* (2006.01)

(52) U.S. Cl.
CPC .............. *H05H 1/46* (2013.01); *H01J 37/3244* (2013.01); *H01J 37/3299* (2013.01); *H01J 37/32183* (2013.01); *H01J 37/32935* (2013.01); *H05H 2001/4682* (2013.01)

(58) Field of Classification Search
USPC ............. 156/345.28, 345.44, 345.48, 345.49, 156/345.45, 345.46, 345.47, 345.43, 156/345.24, 345.1; 118/715, 722, 723 R, 118/723 I, 723 IR
See application file for complete search history.

(56) References Cited

U.S. PATENT DOCUMENTS

| 4,353,777 A | 10/1982 | Jacob |
| 4,457,820 A | 7/1984 | Bergeron et al. |
| 5,571,366 A | 11/1996 | Ishii et al. |

(Continued)

FOREIGN PATENT DOCUMENTS

| CN | 101110347 A | 1/2008 |
| WO | 9914699 A1 | 3/1999 |
| WO | 2014070838 A1 | 5/2014 |

OTHER PUBLICATIONS

Lars Christoph, Comparison of Applied Materials DPS Chambers used for poly-Si Etch process by Plasma Parameters, Dec. 6, 2000, 2nd workshop on self excited electron plasma resonance spectroscopy, Dredsen, Germany.

(Continued)

*Primary Examiner* — Tuyet Vo
(74) *Attorney, Agent, or Firm* — Martine Penilla Group, LLP

(57) ABSTRACT

Systems and methods for tuning a parameter associated with plasma impedance are described. One of the methods includes receiving information to determine a variable. The information is measured at a transmission line and is measured when the parameter has a first value. The transmission line is used to provide power to a plasma chamber. The method further includes determining whether the variable is at a local minima and providing the first value to tune the impedance matching circuit upon determining that the variable is at the local minima. The method includes changing the first value to a second value of the parameter upon determining that the variable is not at the local minima and determining whether the variable is at a local minima when the parameter has the second value.

14 Claims, 13 Drawing Sheets

(56) References Cited

U.S. PATENT DOCUMENTS

| | | |
|---|---|---|
| 5,989,999 A | 11/1999 | Levine et al. |
| 6,157,867 A | 12/2000 | Hwang et al. |
| 6,441,555 B1 | 8/2002 | Howald et al. |
| 6,781,317 B1 | 8/2004 | Goodman |
| 7,361,287 B2 | 4/2008 | Laermer |
| 7,764,140 B2 | 7/2010 | Nagarkatti et al. |
| 8,053,991 B2 | 11/2011 | Kim et al. |
| 8,103,492 B2 | 1/2012 | Brcka |
| 8,679,358 B2 | 3/2014 | Nakagawa |
| 2003/0119308 A1 | 6/2003 | Geefay et al. |
| 2005/0057165 A1 | 3/2005 | Goodman |
| 2005/0205532 A1 | 9/2005 | Patrick et al. |
| 2005/0241762 A1 | 11/2005 | Paterson et al. |
| 2006/0054596 A1 | 3/2006 | Howard |
| 2007/0021935 A1 | 1/2007 | Larson et al. |
| 2007/0095788 A1 | 5/2007 | Hoffman et al. |
| 2007/0127188 A1 | 6/2007 | Yang et al. |
| 2008/0241016 A1 | 10/2008 | Kato et al. |
| 2009/0255800 A1 | 10/2009 | Koshimizu |
| 2010/0136793 A1 | 6/2010 | Chen et al. |
| 2010/0248488 A1 | 9/2010 | Agarwal et al. |
| 2010/0332201 A1 | 12/2010 | Albarede et al. |
| 2012/0052689 A1 | 3/2012 | Tokashiki |
| 2012/0187844 A1 | 7/2012 | Hoffman et al. |
| 2012/0227484 A1 | 9/2012 | Chen et al. |
| 2012/0262064 A1 | 10/2012 | Nagarkatti et al. |
| 2013/0180951 A1 | 7/2013 | Indrakanti et al. |
| 2014/0062303 A1 | 3/2014 | Hoffman et al. |
| 2014/0066838 A1 | 3/2014 | Hancock |
| 2014/0076713 A1 | 3/2014 | Valcore, Jr. et al. |
| 2014/0305589 A1 | 10/2014 | Valcore, Jr. et al. |
| 2015/0002018 A1 | 1/2015 | Lill et al. |

OTHER PUBLICATIONS

Christoph Steuer, TOOL Comparison at GC Stack Etch in LAM TCP Using Plasma Parameters (SEERS), Dec. 12, 2000, 2nd workshop on self excited electron plasma resonance spectroscopy, Dredsen, Germany.

Lars Christoph, Comparison of Applied Materials DPS Chambers used for poly-Si Etch process by Plasma Parameters, Dec. 6, 2000, 2nd workshop on self excited electron plasma resonance spectroscopy, Dredsen Germany.

Christoph Steuer, TOOL Comparison at GC Stack Etch in LAM TCP Using Plasma Parameters (SEERS), Dec. 12, 2000, 2nd workshop on self excited electron plasma resonance spectroscopy, Germany.

TUNING A PARAMETER ASSOCIATED WITH PLASMA IMPEDANCE

CLAIM OF PRIORITY

This application is a divisional of and claims priority under 35 U.S.C. §120 to U.S. patent application Ser. No. 13/740,047, filed on Jan. 11, 2013, titled "Tuning A Parameter Associated With Plasma Impedance", which is incorporated by reference herein in its entirety.

FIELD

The present embodiments relate to determining a parameter at which plasma impedance can be controlled, and to apparatus, methods, and computer programs for tuning a parameter associated with plasma impedance.

BACKGROUND

A plasma system includes a plasma chamber and a radio frequency (RF) generator. The generator generates an RF signal that provides power to an electrode within the plasma chamber. The RF signal has characteristics, e.g., frequency and power. With a change in the characteristics, there is a change in plasma impedance. The frequency and power are controlled to control the plasma impedance.

It is in this context that embodiments described in the present disclosure arise.

SUMMARY

Embodiments of the disclosure provide apparatus, methods and computer programs for tuning a parameter associated with plasma impedance. It should be appreciated that the present embodiments can be implemented in numerous ways, e.g., a process, an apparatus, a system, a device, or a method on a computer-readable medium. Several embodiments are described below.

In an embodiment, a plasma system is provided. In the plasma system, a parameter, e.g., frequency, power, capacitance, inductance, etc., is tuned to a value based on a local minima of a variable. Examples of the variable include source impedance at an input of an impedance matching circuit of the plasma system, gamma that is associated with plasma of the plasma system, reflected power, etc. The local minima is determined based on stability of the variable when the parameter is assigned one or more values and/or based on whether the variable exceeds a threshold when the parameter is assigned the one or more values. When the local minima is used, a quick resolution of a value of the parameter is achieved and the resolution is satisfactory in achieving decent values of the variable. For example, use of the local minima reduces time taken to tune a parameter to achieve the local minima compared to time taken to tune a parameter to achieve the absolute minima.

In one embodiment, a method for tuning a parameter associated with plasma impedance is described. The method includes receiving information to determine a variable. The information is measured at a transmission line and is measured when the parameter has a first value. The transmission line is used to provide power to a plasma chamber via an impedance matching circuit. The method further includes determining whether the variable is at a local minima and providing the first value to tune the impedance matching circuit upon determining that the variable is at the local minima. The method includes changing the first value to a second value of the parameter upon determining that the variable is not at the local minima and determining whether the variable is at a local minima when the parameter has the second value. The method is executed by a processor.

In one embodiment, a method for tuning a parameter associated with plasma impedance is described. The method includes receiving information to determine a variable. The information is measured at a transmission line and is measured when the parameter has a first value. The transmission line is used to provide power to a plasma chamber via an impedance matching circuit. The method further includes determining whether the variable is at a local minima and providing the first value to generate a radio frequency (RF) signal upon determining that the variable is at the local minima. The RF signal corresponds to the first value and is to be sent to the plasma chamber. The method includes changing the first value to a second value of the parameter upon determining that the variable is not at the local minima and determining whether the variable is at a local minima when the parameter has the second value. The method is executed by a processor.

In one embodiment, a method for tuning a parameter associated with plasma impedance is described. The method includes receiving information to determine a variable. The information is measured at a transmission line and is measured when the parameter has a first value. The transmission line is used to provide power to a plasma chamber via an impedance matching circuit. The method also includes determining whether the variable is at a local minima when the parameter has the first value and determining whether the first value of the parameter is within a limit of a learned value upon determining that the variable is at the local minima. The learned value is determined during a learning routine. The method includes providing the learned value to generate a radio frequency (RF) signal or to tune the impedance matching circuit upon determining that the first value of the parameter is within the limit. The method includes changing the first value to a second value of the parameter upon determining that the parameter has the first value that is outside the limit. The method is executed by a processor.

In an embodiment, a method for tuning a parameter associated with plasma impedance is described. The method includes receiving information to determine a variable. The information is measured at a transmission line and is measured when the parameter has a first value. The transmission line is used to provide power to a plasma chamber via an impedance matching circuit. The method further includes determining a local minima of the variable. The local minima is achieved when the parameter has the first value. The method also includes tuning the parameter by changing the first value to one or more other values of the parameter, determining a number of events for which the variable is unstable when the parameter has the one or more other values, and determining whether the number of events exceeds a boundary. The method includes reversing a direction of tuning the parameter upon determining that the number of events exceeds the boundary and discontinuing further tuning of the parameter upon determining that the number of events does not exceed the boundary. The method is executed by a processor.

In an embodiment, the local minima is other than an absolute minima.

Some advantages of the above-described embodiments include finding a tuned parameter corresponding to a local minima of a variable and controlling a process with the tuned parameter. The local minima is achieved when the variable is stable and/or a value of the variable does not exceed a threshold. For example, an electrode of a plasma chamber is operated at a frequency and/or power that corresponds to stability of gamma associated with plasma within the plasma chamber. As another example, an electrode of a plasma chamber is operated at a frequency and/or power that corresponds to the gamma that does not exceed a threshold. As yet another example, an impedance matching circuit is operated at a frequency, a capacitance of a capacitor within the impedance matching circuit is changed, and/or an inductance of an inductor within the impedance matching circuit is changed to achieve a value of reflected power that is less than the threshold. The stability of the variable and/or control of the variable to reduce chances of exceeding the threshold helps perform a controlled process, e.g., etching, deposition, cleaning, etc., on a substrate within the plasma chamber. The process is controlled by maintaining the parameter corresponding to the variable that is stable and/or that does not exceed the threshold.

Furthermore, advantages of the above-described embodiments include taking less time to find a local minima than that taken to find an absolute minima of a variable. Finding the absolute minima takes more time than finding the local minima. For example, a parameter is to be changed more further down a path to achieve the absolute minima after a local minima is found. The change takes more time than that taken to find the local minima.

Also, advantages of the above-described embodiments include achieving better stability in a variable associated with plasma and/or better chances of the variable not exceeding a threshold by using a value of a parameter learned during a learning routine to adjust a tuned parameter. The tuned parameter is achieved during a process performed on a substrate. For example, the tuned parameter is tuned to achieve stability in the variable and/or to reduce chances of the parameter exceeding the threshold. In this example, the tuned parameter is further adjusted to achieve the learned value of the parameter. The learned value is a value that helps achieve a higher level of stability than that achieved during the process with the tuned parameter and/or that does a better job of reducing chances of the parameter exceeding the threshold than that done using the tuned parameter.

Advantages of the above-described embodiments include discounting a number of events within plasma that does not exceed a boundary in determining whether to change a direction of tuning a parameter. For example, a direction in which a parameter is tuned during processing of a substrate is change when a number of events during the tuning exceeds a boundary and not changed when the number of events does not exceed the boundary. If the number of events does not exceed the boundary, the occurrence of the events are aberrations in instability of a variable associated with plasma and the aberrations are not considered in determining whether the direction is to be reversed. On the other hand, if the number of events exceeds the boundary, the occurrence of events indicate an instability in the variable and the direction is reversed.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for tuning a parameter associated with plasma impedance. It will be apparent that the present embodiments may be practiced without some or all of these specific details. In other instances, well known process operations have not been described in detail in order not to unnecessarily obscure the present embodiments.

Figure 1:
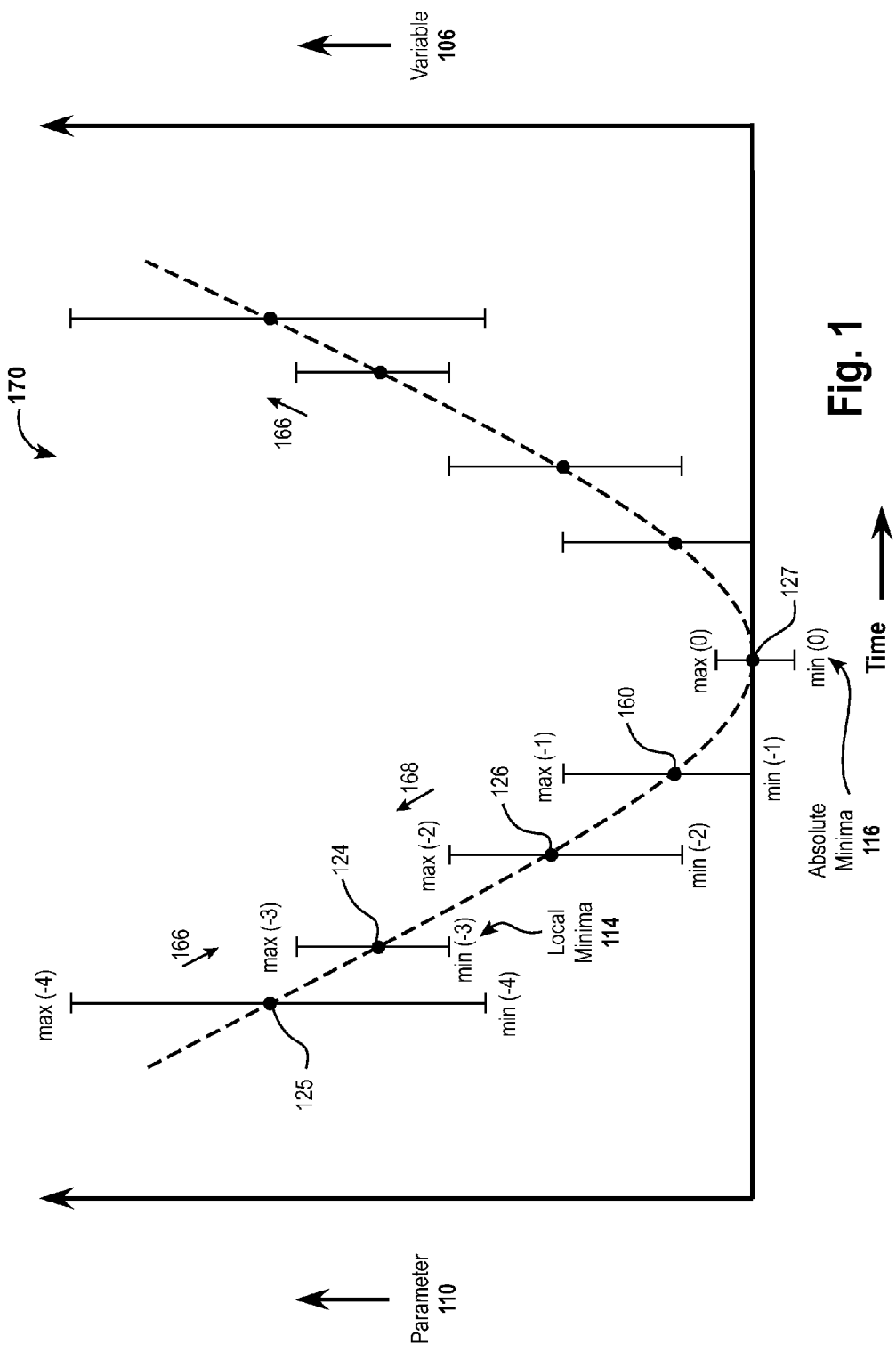
FIG. 1 is a diagram of a graph for illustrating various methods for tuning a parameter associated with plasma impedance, in accordance with an embodiment described in the present disclosure.

FIG. 1 is a diagram of an embodiment of a graph 170 for illustrating various methods for tuning a parameter associated with plasma impedance. The graph 170 plots a parameter 110 versus time, which is measured in units, e.g. seconds, minutes, etc. Examples of the parameter 110 include frequency, capacitance, inductance, power, or a combination thereof. Examples of frequency include a frequency of a radio frequency (RF) signal generated by an RF generator. The RF signal is supplied to an electrical component, e.g., capacitor, inductor, etc., of an impedance matching circuit. In some embodiments, the reflected and forward powers are measured at an output of the RF generator.

The graph 170 further plots a variable 106 versus time. Examples of the variable 106 include gamma, reflected power, complex voltage reflection coefficient Γ, delivered power, forward power, voltage standing wave ratio (VSWR), source impedance at an input of an impedance matching circuit, etc. It should be noted that the complex voltage reflection coefficient Γ is sometimes referred to herein as a reflection coefficient. An example of gamma includes a relation between reflected power and forward power, e.g., a ratio of reflected power to forward power. An example of delivered power is a difference between forward power and reflected power. The forward power is power generated and sent from a radio frequency (RF) generator via a transmission line to a plasma chamber. The reflected power is power reflected from the plasma chamber towards the RF generator.

Figure 2:
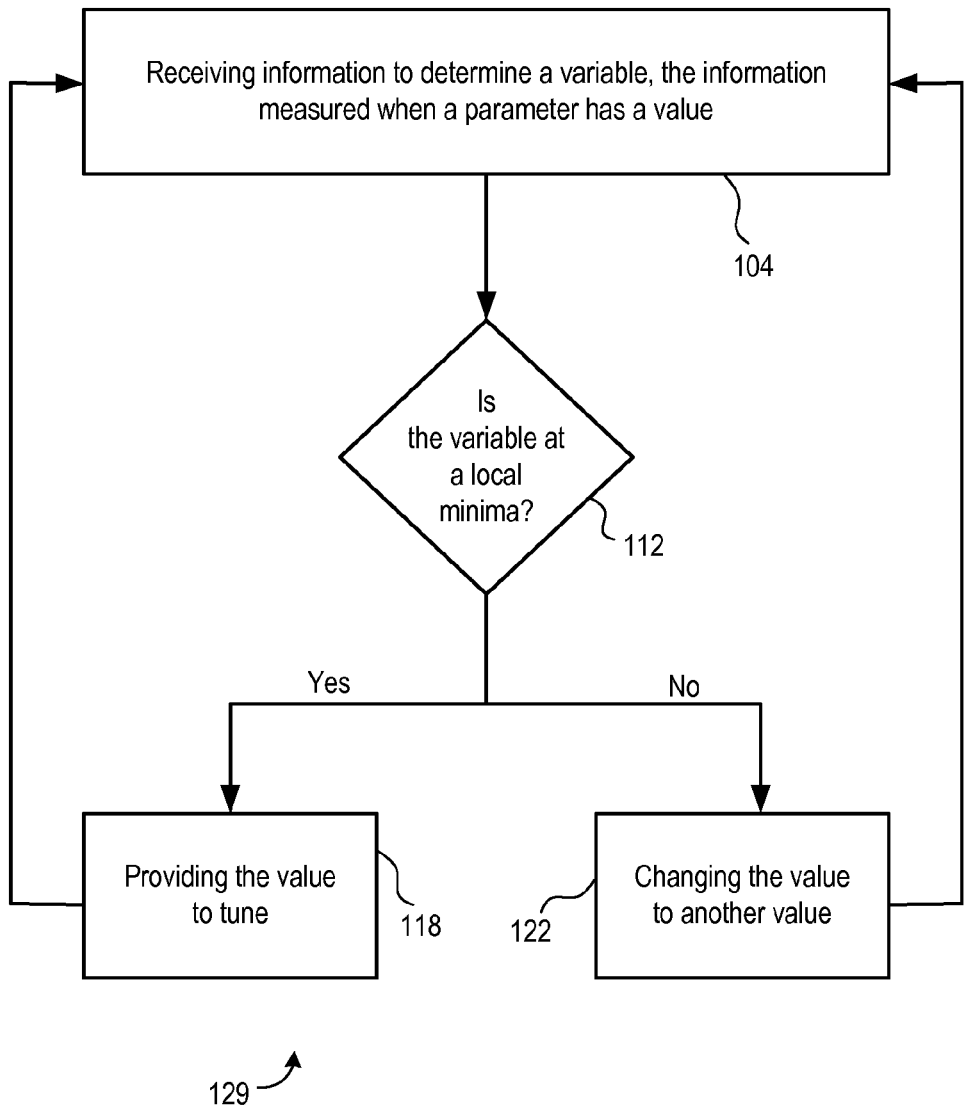
FIG. 2 is a flowchart of a method for determining a tuned parameter, in accordance with an embodiment described in the present disclosure.

FIG. 2 is a flowchart of an embodiment of a method 129 for determining a tuned parameter. The method 129 is executed by one or more processors of a plasma system, e.g., the processor of the RF generator, a processor of a host system, etc. Examples of a processor include an application specific integrated circuit (ASIC), a programmable logic device (PLD), a microprocessor, a microcontroller, a central processing unit (CPU), etc. The RF generator is an A megahertz (MHz) RF generator. The A MHz RF generator and the host system are further described below.

FIG. 2 is understood with reference to the graph 170 of FIG. 1. In an operation 104, information is received to determine the variable 106. The information is measured at the transmission line. Examples of the information include the forward power, the reflected power, voltage, current, or a combination thereof. The information is measured with a sensor that is coupled to the transmission line.

The information is measured when the parameter 110 has a first value 124 (FIG. 1). For example, the sensor measures the forward and reflected powers at a time the A MHz RF generator supplies an RF signal having a power value of P kilowatts (kW) and/or a frequency of F MHz to the plasma chamber via the transmission line, where A, P, and F are real numbers greater than zero. Examples of A MHz include 2 MHz, 27 MHz, and 60 MHz. Examples of P include P1 and P0, which are explained below. Moreover, examples of F include F1 and F0, which are also explained below. In some embodiments, A MHz is the same as F MHz. As another example of measuring information, the sensor measures voltage and current or forward and reflected powers on the transmission line at the same time a processor of the A MHz RF generator provides power and/or frequency values to a driver and amplifier system (DAS) of the A MHz RF generator to allow the DAS to generate an RF signal having values that correspond to, e.g., are the same as, are amplified values of, etc., the power and frequency values.

It should be noted that one or more sensors measure information at an output of the A MHz RF generator or at an input of the impedance matching circuit that is coupled to the A MHz RF generator via the transmission line. For example, the one or more sensors measure forward power and reflected power at the output of the A MHz RF generator, voltage and current at an input of the impedance matching circuit, voltage and current at an output of the A MHz RF generator, etc. The voltage and current measured at the input of the impedance matching circuit are used to calculate a source impedance at the input of the impedance matching circuit. The calculation is performed by one or more processors of the plasma system, which is described below. The forward and reflected power at the output of the A MHz RF generator is used to calculate delivered power. The calculation is performed by one or more processors of the plasma system.

The variable 106 is determined from the information. For example, a ratio of the voltage and current that are measured at the transmission line is calculated. As another example, a ratio of the reflected and forward powers that are measured at the transmission line is computed. As yet another example, a difference between forward power and reflected power is calculated to determine delivered power at an output of the A MHz RF generator. As another example, a source impedance at an input of the impedance matching circuit is calculated. As another example, the complex voltage reflection coefficient Γ is calculated.

In an operation 112, it is determined whether the variable 106 is at a local minima 114 when the parameter has the first value 124, which is a value during a state S1 or a state S0. For example, it is determined whether the variable exceeds a threshold when the parameter has the first value 124. As another example, it is determined whether reflected power determined from the information exceeds a threshold when a capacitance of a variable capacitor within the impedance matching circuit has the first value 124. As yet another example, it is determined whether reflected power determined from the information exceeds a threshold when an inductance of a variable inductor within the impedance matching circuit has the first value 124. As another example, it is determined whether reflected power determined from the information exceeds a threshold when a frequency of operation of the impedance matching circuit has the first value 124. In some embodiments, a frequency of operation of the impedance matching circuit is the same as frequency of an RF signal supplied to the impedance matching circuit by the A MHz RF generator. As another example, it is determined whether reflected power determined from the information exceeds a threshold when a capacitance of a variable capacitor within the impedance matching circuit has a value, when an inductance of an inductor within the impedance matching circuit has a value, and/or when a frequency of operation of the impedance matching circuit has a value. It should be noted that in this example, the inductance, the capacitance, and/or the frequency of operation correspond to the first value 124. To illustrate, the first value 124 is achieved when the frequency value, the inductance, and/or the capacitance is achieved. An example of the threshold includes a gamma value of 0.5. Another example of a threshold includes a gamma value of 0.6. Yet another example of a threshold includes a source impedance of Z1 ohms, where Z1 is a real number greater than zero. Another example of a threshold includes a reflected power within a range of 0 watts. A reflected power of a value, e.g., 0.2 watts, 0.5 watts, 1 watt, 10 watts, 20 watts, 100 watts, 200 watts, etc., is within a range of 0 watts. The states S1 and S0 are further described below.

As another example of determining whether the variable 106 is at the local minima 114, it is determined whether the variable 106 is stable when the parameter has the first value 124. In this example, it is determined whether the variable 106 lacks oscillation to determine whether the variable 106 is stable. To illustrate, it is determined whether the variable 106 oscillates between two values when the parameter has the first value 124. As another illustration, it is determined whether the variable 106 oscillates between a first value of delivered power and a second value of delivered power. In this example, in response to determining that the variable 106 oscillates between the two values, it is determined that the variable 106 is unstable. Otherwise, upon determining that the variable 106 lacks the oscillation between the two values, it is determined that the variable 106 is stable. As another example, it is determined whether the variable 106 oscillates between a minimum value, e.g., a minimum delivered power value, a minimum source impedance value, a minimum reflected power value, etc., and a maximum value, e.g., a maximum delivered power value, a maximum source impedance value, a maximum reflected power value, etc., when the parameter has the first value and whether a range between the minimum and maximum values exceeds a predetermined range. In this example, upon determining that the range between the minimum and maximum values exceeds the predetermined range, it is determined that the variable 106 is unstable. Otherwise, upon determining that the range between the minimum and maximum values does not exceed the predetermined range, it is determined that the variable 106 is stable.

Upon determining that the variable 106 exceeds the threshold or the variable 106 is unstable, it is determined that the variable 106 is not at the local minima 114. On the other hand, upon determining that the variable 106 does not exceed the threshold and the variable 106 is stable, it is determined that the variable 106 is at the local minima 114.

In one embodiment, instead of determining in the alternative that the variable 106 exceeds the threshold or the variable 106 is unstable to determine that the variable 106 is not at the local minima 114, it is determined that the variable 106 is not at the local minima upon determining that the variable 106 exceeds the threshold and the variable 106 is unstable.

In some embodiments, instead of determining both that the variable 106 does not exceed the threshold and the variable 106 is stable to determine that the variable 106 is at the local minima 114, it is determined that the variable 106 is at the local minima upon determining that the variable 106 does not exceed the threshold or the variable 106 is stable.

It should be noted that in an embodiment, the method 129 is executed during processing of, e.g., etching layers deposited on, depositing layers on, cleaning, etc., a substrate within the plasma chamber. For example, the method 129 is executed without using a learned value, which is further described below. One or more processors of the plasma system do not apply the learned value during execution of the method 129.

In one embodiment, the learned value is generated by one or more processors of the plasma system during a learning routine. During the learning routine, pulsed plasma is not struck within the plasma chamber to process the substrate. In this embodiment, the learning routine is executed in a similar manner in which the method 129 is executed. In some embodiments, during the learning routine, pulsed plasma is struck within the plasma chamber without processing the substrate. In these embodiments, the learning routine is executed in a similar manner in which the method 129 is executed. An example of a substrate includes a wafer. Another example of a substrate includes a wafer on which electrical circuitry, e.g., circuitry including transistors, resistors, capacitors, logic gates, etc., is fabricated.

It should further be noted that in one embodiment, the local minima 114 is found by traversing a path from a value 125 via the first value 124 to a second value 126 in a direction 166. For example, the host system controls a motor system, which is further described below, to change capacitance of a capacitor of the impedance matching circuit to the value 125. As another example, the host system controls the motor system or controls an amount of current to an inductor of the impedance matching circuit to change inductance of the inductor to the value 125. As yet another example, the host system determines to provide a frequency having the value 125 to the A MHz RF generator, which generates an RF signal having the value 125 and provides the RF signal to the impedance matching circuit to operate the impedance matching circuit at the value 125. As yet another example, the host system controls the motor system to change capacitance of a capacitor of the impedance matching circuit to a value, controls the motor system or controls an amount of current to an inductor of the impedance matching circuit to change inductance of the inductor to a value, and determines to provide a frequency to the A MHz RF generator to operate the impedance matching circuit at the frequency value. In this example, the value 125 includes the capacitance value, the inductance value, and/or the frequency value. To illustrate, the value 125 corresponds to the capacitance value, the frequency value, and/or the inductance value. To illustrate further, the value 125 is achieved when the capacitance, the inductance, and/or the frequency value is achieved. As another example, the processor of the A MHz RF generator determines to provide the parameter 110 having the value 125 to the DAS of the A MHz RF generator. The DAS of the A MHz RF generator generates an RF signal corresponding to the value 125 and provides the RF signal via the transmission line to the plasma chamber.

One or more sensors of the plasma system sense the transmission line to measure the information when the parameter 110 has the value 125. One or more processors of the plasma system determine one or more values of the variable 106 when the parameter has the value 125. Similarly, one or more processors of the plasma system determine one or more values of the variable 106 when the parameter 110 has the first value 124 and the second value 126.

Furthermore, one or more processors of the plasma system determine whether the one or more values of the variable 106 when the parameter 110 has the value 125 are stable and do not exceed the threshold. Moreover, the one or more processors determine whether the one or more values of variable 106 when the parameter 110 has the first value 124 are stable and do not exceed the threshold and whether the one or more values of variable 106 when the parameter 110 has the second value 126 are stable and do not exceed the threshold.

Upon determining that the one or more values of variable 106 when the parameter 110 has the first value 124 are stable and do not exceed the threshold, that the one or more values of variable 106 when the parameter 110 has the value 125 are unstable or exceed the threshold, and that the one or more values of variable 106 when the parameter 110 has the second value 126 are unstable or exceed the threshold, the one or more processors determine that the variable 106 is at the local minima 114 when the parameter has the first value 124.

In an embodiment, the local minima 114 is found by traversing the path from the value 125 via the first value 124 in the direction 166 and stopping when the local minima 114 is found. For example, once the local minima 114 is found, the one or more processors of the plasma system do not further traverse the path in the direction 166 to determine whether the one or more values of variable 106 when the parameter 110 has the second value 126 are unstable or exceed the threshold. Rather, in this example, once it is determined that the one or more values of variable 106 when the parameter 110 has the first value 124 are stable and do not exceed the threshold, the one or more processors determine that the local minima 114 is found.

In response to determining that the variable 106 is at the local minima 114 when the parameter has the first value 124, in an operation 118, one or more processors of the host system continue to tune the impedance matching circuit and/or the A MHz RF generator to maintain the parameter at the first value 124. For example, a processor of the host system instructs a digital signal processor (DSP) of the A MHz RF generator to continue to provide the parameter 110 having the first value 124 to the DAS of the A MHz RF generator and the DAS of the A MHz RF generator continues to generate the RF signal having a parameter having the first value 124. As another example, the host system continues to provide a control signal to the motor system to hold capacitor plates of a capacitor at a distance within the impedance matching circuit to maintain a capacitance of the first value 124. As another example, the host system continues to provide a control signal to the motor system or continues to provide a current to an inductor within the impedance matching circuit to maintain an inductance of the first value 124 of the inductor. As yet another example, the host system controls the impedance matching circuit to maintain operation of the impedance matching circuit at a frequency value, which is an example of the first value 124. As yet another example, the host system continues to provide a control signal to the motor system to hold capacitor plates of a capacitor at a distance within the impedance matching circuit to maintain a capacitance, continues to provide a control signal to the motor system or continues to provide a current to an inductor within the impedance matching circuit to maintain an inductance of the inductor, and/or controls the impedance matching circuit to maintain operation of the impedance matching circuit at a frequency value. It should be noted that in this example, the first value 124 corresponds to the capacitance, the inductance, and/or the frequency value. The operation 104 repeats after the operation 118.

On the other hand, upon determining that the variable 106 is not at the local minima 114 when the parameter has the first value 124, in an operation 122, the first value 124 is changed to another value, e.g., the second value 126. As an example, the other value is provided by the processor of the A MHz RF generator to the DAS of the A MHz RF generator consecutive to the provision of the first value 124. To illustrate, after the first value 124 is provided, no values between the first value 124 and the second value 126 are provided by the processor of the A MHz RF generator to the DAS of the A MHz RF generator. As yet another example, the second value 126 is provided by the host system to the motor system to achieve a capacitance or an inductance within the impedance matching circuit of the second value 126. As another example, the second value 126 is provided by the host system to the A MHz RF generator to achieve a frequency of operation of the second value 126 of the impedance matching circuit. As yet another example, a capacitance is provided to the motor system by the host system, an inductance is provided to the motor system by the host system, and/or the impedance matching circuit is controlled by the host system to operate at a frequency to achieve the second value 126. As yet another example, a capacitance is provided to the motor system by the host system, a current is provided to an inductor of the impedance matching circuit, and/or the impedance matching circuit is controlled by the host system to operate at a frequency to achieve the second value 126.

The method 129 repeats after the operation 122 with respect to the second value 126 rather than with respect to the first value 124. For example, when the parameter 110 has the second value 126, the DAS of the A MHz RF generator generates and provides an RF signal having a value corresponding to the second value 126 to the plasma chamber via the transmission line. As another example, when an indication is received from one or more processors of the plasma system that a capacitance of a capacitor of the impedance matching circuit is to be of the second value 126, the motor system moves plates of a capacitor of the impedance matching circuit to achieve a capacitance of the second value 126. As yet another example, when an indication is received from one or more processors of the plasma system that an inductance of an inductor of the impedance matching circuit is to be of the second value 126, the motor system changes, e.g., increases, decreases, etc., an amount of insertion of an iron core within an inductor of the impedance matching circuit to achieve an inductance of the second value 126. As another example, when an indication is received from one or more processors of the plasma system that an inductance of an inductor of the impedance matching circuit is to be of the second value 126, the host system changes an amount of current supplied to an inductor of the impedance matching circuit to achieve an inductance of the second value 126. As yet another example, when an indication is received from one or more processors of the plasma system that a frequency of operation of the impedance matching circuit is to be of the second value 126, the impedance matching circuit is operated at the second value 126 of frequency via the A MHz RF generator. It should be noted that as another example, a combination of a capacitance of a capacitor within the impedance matching circuit, an inductance of an inductor within the impedance matching circuit, and a frequency of operation of the impedance matching circuit is applied to achieve the second value 126. For example, the motor system operates plates of a capacitor of the impedance matching circuit and an inductance of an inductor of the impedance matching circuit is controlled to achieve the second value 126, which includes, in this example, a capacitance of the capacitor and the inductance of the inductor. When the parameter 110 is changed to the second value 126 and the second value 126 is applied to the plasma system, the information is received to determine one or more values of the variable 106.

The sensor of the A MHz RF generator measures the information at the transmission line when the parameter 110 has the second value 126. The one or more values of the variable 106 are determined by one or more processors of the plasma system based on the measured information when the parameter 110 has the second value 126. Moreover, in the operation 112, it is determined whether the one or more values of the variable 106 when the parameter 110 has the second value 126 are at a local minima.

It should be noted that in various embodiments, a difference between any two values of the parameter 110, e.g., frequency values, etc., that are consecutively provided by one or more processors of the plasma system to the DSP of the A MHz RF generator and/or to the motor system while traversing in the direction 166 is minimal. For example, the difference between the value 125 and the first value 124 is within a range of kilohertz (kHz). As another example, a difference between the value 125 and the first value 124 is between 10 and 20 kHz.

Moreover, in some embodiments, a difference between any two values of the parameter 110 that are consecutively provided by one or more processors of the plasma system to the DSP of the A MHz RF generator and/or to the motor system while traversing in the direction 166 is the same. For example, a difference between the first value 124 and the value 125 is the same as a difference between the second value 126 and the first value 124.

It should be noted that in one embodiment, the local minima is other than an absolute minima 116. For example, the one or more processors of the plasma system do not need to search for the absolute minima 116 once the local minima 114 is determined. If the one or more processors continue to tune the parameter 110 in the direction 166 after the local minima 114 is determined, the absolute minima 116 is found. The absolute minima 116 is achieved when the parameter 110 has a value 127. An example of the absolute minima 116 includes reflected power of zero watts. Another example of the absolute minima 116 includes a source impedance at an input of the impedance matching circuit of 50 ohms. In some embodiments, a source impedance at an input of the impedance matching circuit includes an impedance of the A MHz RF generator and the transmission line as determined from the input of the impedance matching circuit.

In an embodiment, a range of oscillation of the variable 106 when the parameter 110 has the value 127 is less than a range of oscillation of the variable 106 when the parameter 110 has the first value 124. In some embodiments, a maximum value max(0) of the variable 106 when the parameter has the value 127 is less than a maximum value max(−3) when the parameter has the first value 124. In these embodiments, both the maximum values max(0) and max(−3) do not exceed the threshold.

It should further be noted that min and max shown in FIG. 1 are minimum and maximum values of the variable 106. For example, values min(−4) and max(−4) are values of the variable 106 when the parameter 110 has the value 125. As another example, values min(−3) and max(−3) are values of the variable 106 when the parameter 110 has the first value 124, values min(−2) and max(−2) are values of the variable 106 when the parameter 110 has the second value 126, and values min(−1) and max(−1) are values of the variable 106 when the parameter 110 has a value 160, and values min(0) and max(0) are values of the variable 106 when the parameter 110 has the value 127.

In one embodiment, the local minima 114 is an absolute minima.

Figure 3:
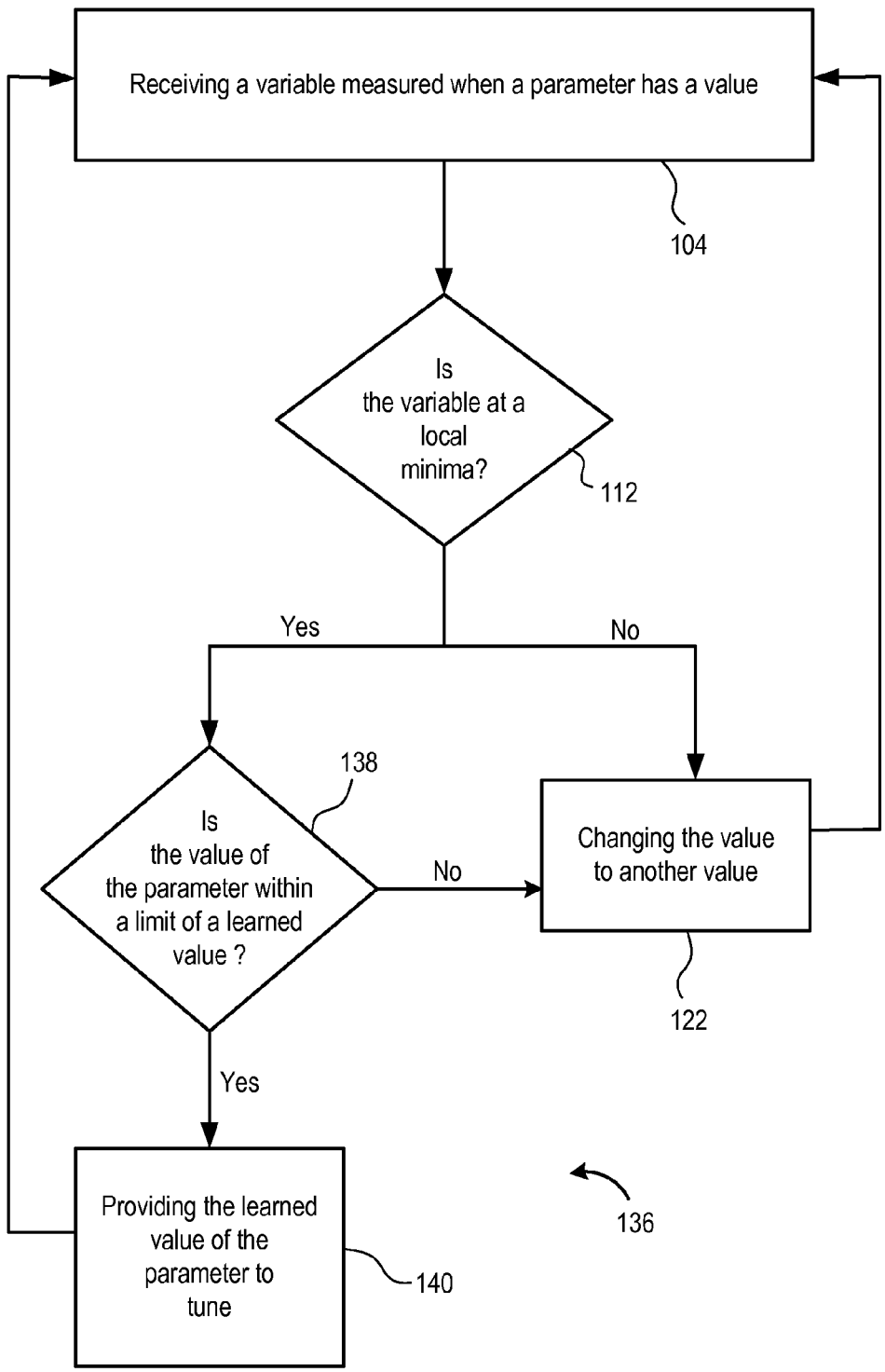
FIG. 3 is a flowchart of a method for using the learning routine to determine a tuned parameter, in accordance with an embodiment described in the present disclosure.

FIG. 3 is a flowchart of an embodiment of a method 136 for using the learning routine to determine a tuned parameter. The method 136 is executed by one or more processors of the plasma system.

The method 136 includes the operations 104, 112, and 122, which are described above with reference to FIGS. 1 and 2. Moreover, with reference to FIGS. 1 and 3, upon determining that the variable 106 is at the local minima 114 when the parameter has the first value 124, in an operation 138, it is determined whether the first value 124 is within a limit of the learned value, e.g., the value 160 (FIG. 1). For example, it is determined whether a difference between the learned value and the first value 124 is less than the limit, e.g., 10 kHz, 20 KHz, 1 kilowatts (kW), 10 kW, 1 watt, 10 watts, 1 ohm, 5 ohm, 2 ohm, etc. In one embodiment, the limit is within a range of kHz.

The learned value is a value that is learned by the processor of the A MHz RF generator during the learning routine. For example, during the learning routine, one or more processors of the plasma system traverse the path in the direction 166 and instead of determining that the variable 106 is at the local minima 114 when the parameter 110 has the first value 124, the one or more processors determine that the variable 106 is at a local minima when the parameter 110 has the value 160.

Upon determining that the first value 124 is outside the limit of the learned value, in the operation 122, the first value is change to another value. On the other hand, upon determining that the first value 124 is within the limit of the learned value, in an operation 140, the learned value is provided to tune the impedance matching circuit or the A MHz RF generator. For example, one or more processors of the plasma system provided the learned value to the DSP of the A MHz RF generator. The DSP of the A MHz RF generator receives the learned value from one or more processors of the plasma system and provides the learned value to the DAS of the A MHz RF generator. The A MHz RF generator generates an RF signal having a value that corresponds to the learned value, and provides the RF signal to the plasma chamber via the transmission line. As another example, the motor system receives the learned value, e.g., a capacitance value, from one or more processors of the plasma system and controls a capacitor within the impedance matching circuit to achieve the learned value. As yet another example, the motor system receives the learned value, e.g., an inductance value, from one or more processors of the plasma system and controls an inductor within the impedance matching circuit to achieve the learned value. As another example, the motor system receives the learned value, which includes a capacitance value of a capacitor within the impedance matching circuit and an inductance value of an inductor within the impedance matching circuit, from one or more processors of the plasma system and controls the capacitor and the inductor to achieve the learned value. As another example, the impedance matching circuit operates at the learned value, e.g., a frequency, upon receiving the learned value within an RF signal received from the A MHz RF generator, which receives the learned value from one or more processors of the plasma system. As yet another example, the impedance matching circuit is operated at a frequency, capacitance of a capacitor of the impedance matching circuit is controlled, and/or inductance of an inductor of the impedance matching circuit is controlled to achieve the learned value.

The method 136 repeats after the operation 140. For example, the operations 104, 112, 122, and 138 are performed with respect to the learned value instead of the first value 124. To illustrate, when the parameter 110 has the learned value, the DAS of the A MHz RF generator generates and provides an RF signal having a value corresponding to the learned value to the plasma chamber via the transmission line. When the RF signal having the value corresponding to the learned value is provided to the plasma chamber, the information is received to determine one or more values of the variable 106. The sensor of the A MHz RF generator measures the information at the transmission line when the parameter 110 has the learned value. The one or more values of the variable 106 are determined by the processor of the A MHz RF generator based on the measured information when the parameter 110 has the learned value. Moreover, in the operation 112, it is determined whether the one or more values of the variable 106 when the parameter 110 has the learned value are at a local minima. Also, in the operation 122, upon determining that the one or more values of the variable 106 are not at the local minima when the parameter 110 has the learned value, the learned value is changed to another value. As another example, when the motor system controls a capacitor of the impedance matching circuit to achieve the learned value, one or more sensors of the plasma system sense forward power and reflected power on the transmission line. The one or more sensors provides the forward and reflected power values via the DSP of the A MHz RF generator to the host system. The host system determines reflected power from the forward and reflected power values, and determines whether the reflected power value is at the local minima.

It should be noted that in one embodiment, the method 136 is executed during processing of the substrate.

Figure 4:
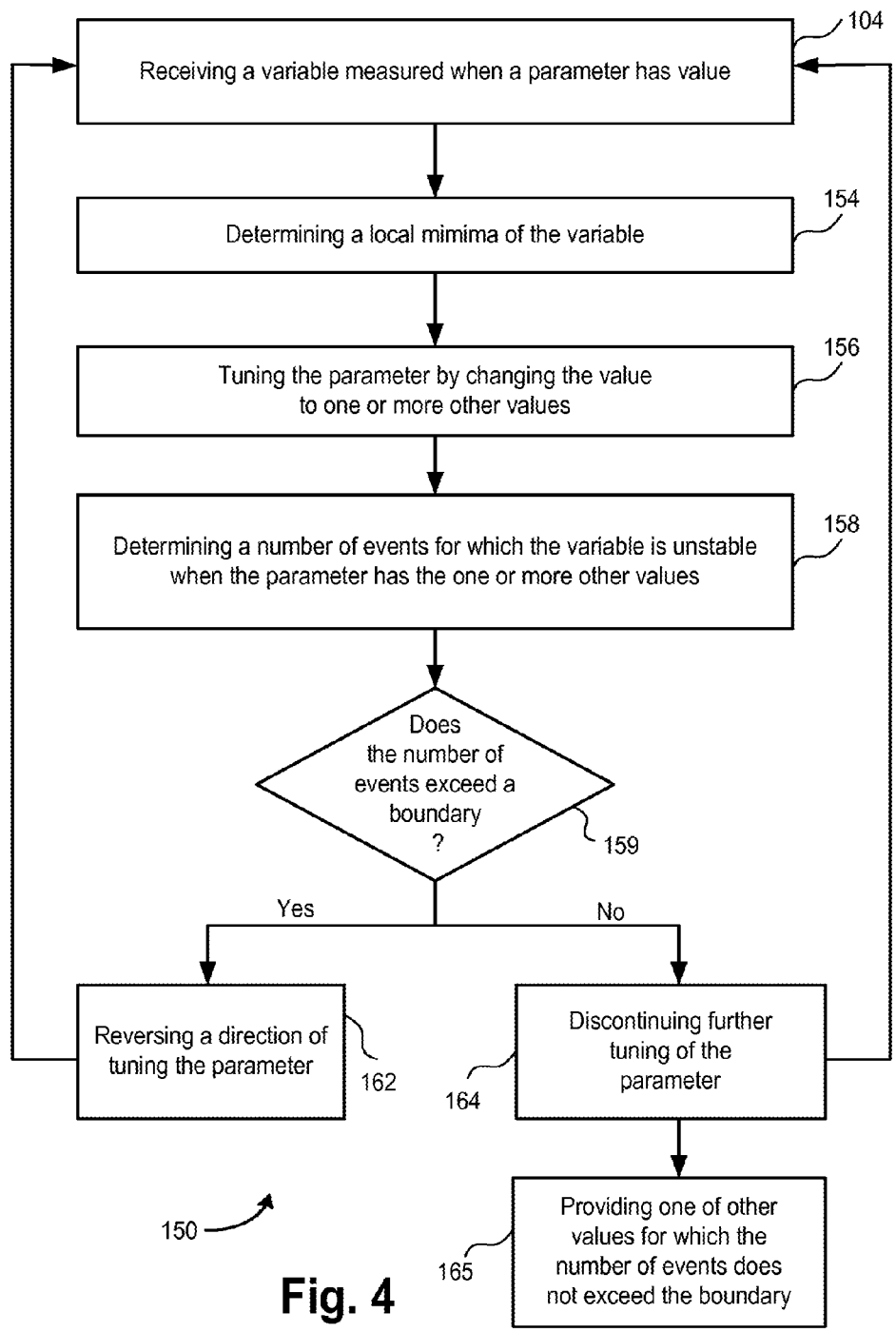
FIG. 4 is a flowchart of a method for determining whether to change a direction of tuning the parameter, in accordance with an embodiment described in the present disclosure.

FIG. 4 is a flowchart of an embodiment of a method 150 for determining whether to change a direction of tuning the parameter 110. The method 150 is executed by one or more processors of the plasma system and is described with reference to FIG. 1.

The operation 104 is performed. With reference to FIGS. 1 and 4, in an operation 154, the local minima 114 of the variable 106 is determined when the parameter 110 has the first value 124. Moreover, in an operation 156, the parameter 110 is tuned by changing the first value 124 to one or more other values, e.g., the second value 126, the value 160, etc., in the direction 166.

In an operation 158, when the parameter 110 is tuned to the one or more other values, a number of events for which the variable 106 is unstable is determined. For example, it is determined whether the variable 106 is unstable when the parameter 110 has the second value 126 and whether the variable 106 is unstable when the parameter 110 has the value 160. In this example, upon determining that the variable 106 is unstable when the parameter 110 has the value 160 and that the variable 106 is unstable when the parameter 110 has the second value 126, it is determined that two events are created, one at each of the values 126 and 160 of the parameter 110. Moreover, in this example, upon determining that the variable 106 is unstable when the parameter 110 has the value 160 and that the variable 106 is stable when the parameter 110 has the second value 126, it is determined that one event has occurred at the value 160.

In an embodiment, instead of determining whether the variable 106 is unstable when the parameter 110 has a value to determine a number of events, it is determined whether the variable 106 exceeds the threshold when the parameter has the value to determine the number of events. For example, it is determined whether the variable 106 exceeds the threshold when the parameter 110 has the second value 126 and whether the variable 106 exceeds the threshold when the parameter 110 has the value 160. In this example, upon determining that the variable 106 exceeds the threshold when the parameter 110 has the value 160 and that the variable 106 exceeds the threshold when the parameter 110 has the second value 126, it is determined two events are created, one at each of the values 126 and 160 of the parameter 110. Moreover, in this example, upon determining that the variable 106 exceeds the threshold when the parameter 110 has the value 160 and that the variable 106 does not exceed the threshold when the parameter 110 has the second value 126, it is determined that one event has occurred at the value 160.

In some embodiments, both the determinations whether the variable 106 is unstable when the parameter 110 has a value and whether the variable 106 exceeds the threshold when the parameter has the value are made to determine the number of events. For example, it is determined whether the variable 106 is unstable when the parameter 110 has the second value 126, whether the variable 106 is unstable when the parameter 110 has the value 160, whether the variable 106 exceeds the threshold when the parameter 110 has the second value 126, and whether the variable 106 exceeds the threshold when the parameter 110 has the value 106. Upon determining that the variable 106 is unstable when the parameter 110 has the value 160, that the variable 106 is unstable when the parameter 110 has the second value 126, that the variable 106 exceeds the threshold when the parameter 110 has the value 160, and that the variable 106 exceeds the threshold when the parameter 110 has the second value 126, it is determined two events have occurred, one at each of the values 126 and 160 of the parameter 110. Moreover, in this example, upon determining that the variable 106 is unstable when the parameter 110 has the value 160 and that the variable 106 exceeds the threshold when the parameter 110 has the value 160 and that the variable 106 is stable when the parameter 110 has the second value 126 and that the variable 106 does not exceed the threshold when the parameter 110 has the second value 126, it is determined that one event has occurred when the parameter has the value 160.

In an operation 159, it is determined whether the number of events exceeds a boundary. For example, it is determined whether the number of events exceeds 2, 3, 4, 6, or another positive integer. In response to determining that the number of events does not exceed the boundary, in an operation 164, further tuning of the parameter 110 is discontinued. For example, the one or more other values achieved in the operation 158 are not further changed to one or more additional values of the parameter 110 to discontinue further tuning of the parameter 110.

In an operation 165, one of the other values achieved in the operation 158 are applied to the plasma system. For example, one of the other values achieved in the operation 158 is provided to the DSP of the A MHz RF generator. As another example, one of the other values achieved in the operation 158 is provided to the motor system. As yet another example, one of the other values achieved in the operation 158 is provided to the impedance matching circuit. The value, which is provided in the operation 165, of the parameter 110 is one for which the number of events does not exceed the boundary. In an embodiment, the value, which is provided in the operation 165, is one for which the number of events exceeds the boundary. In some embodiments, during the operation 165, instead of providing one of the other values that are achieved in the operation 158, the first value 124 at which the local minima 114 is achieved is provided in the operation 165.

Upon receiving the value of the parameter 110 that is provided in the operation 165, the plasma system applies the value. For example, the DAS generates an RF signal having the value and provides the RF signal via the transmission line to the plasma chamber. As another example, the motor system moves plates of a capacitor within the impedance matching circuit to achieve a capacitance, which is an example of the value of the operation 165. As yet another example, the motor system changes a length of an iron core extending through an inductor within the impedance matching circuit to achieve an inductance, which is an example of the value of the operation 165. As another example, the host system changes an amount of current flowing through an inductor within the impedance matching circuit to achieve an inductance, which is an example of the value of the operation 165. As another example, the host system controls the impedance matching circuit to operate at a frequency, which is an example of the value of the operation 165. As still another example, the motor system moves plates of a capacitor within the impedance matching circuit to achieve a capacitance, an inductor of the impedance matching circuit is controlled to achieve an inductance, and/or the host system controls the impedance matching circuit via the A MHz RF generator to operate at a frequency. It should be noted that, in the example, a combination of the inductance, the capacitance, and the frequency is an example of the value of the operation 165. The method 150 repeats after the operation 165.

Upon determining that the number of events exceeds the boundary, in an operation 162, the direction 166 of traversal of the path along which the parameter 110 is tuned is reversed to the direction 168. In one embodiment, when the traversal is along the direction 168, the reversal of the direction is performed to achieve the direction 166. Once the direction 166 is reversed, the method 150 is repeated to tune the parameter 110 in the direction 168.

It should be noted that values of the parameter 110 decrease in the direction 166 until the value 127 is reached and increase thereafter in the direction 166. For example, the values 125, 124, 126, 160, and 127 are in a decreasing order from high to low. Similarly, values of the parameter 110 decrease in the direction 168 until the value 127 is reached and increased from the value 127 to the value 125.

In one embodiment, in the direction 166, values of the parameter 110 increase first and then decrease and in the direction 168, values of the parameter 110 increase first and then decrease.

It should be noted that in one embodiment, the method 150 is executed during processing of the substrate.

It should be noted that although the methods 129, 136, and 150 are described with respect to the direction 166, in one embodiment, the methods 129, 136, and 150 can be executed in a direction 168, which is opposite to the direction 166, along the path.

It should be noted that each method 129, 136, and 150 is executed by one or more processors, e.g., a processor of the host system, by the DSP of the A MHz RF generator, or by a combination of the processor of the host system 190 and the DSP. Although the operations of the methods 129, 136, and 150 were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations is performed in the desired way.

Figure 5:
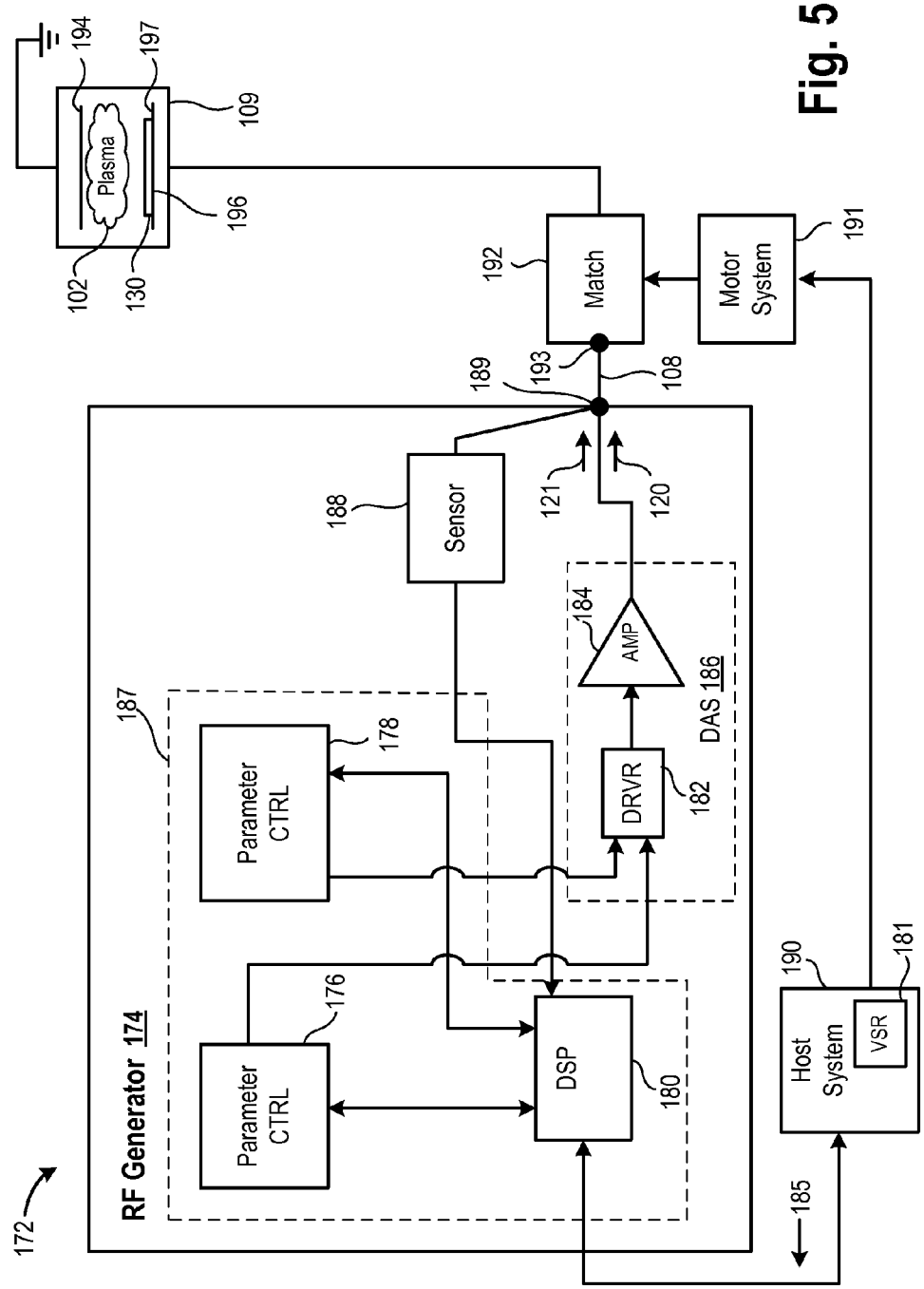
FIG. 5 is a block diagram of a system for tuning the parameter, in accordance with an embodiment described in the present disclosure.

FIG. 5 is a block diagram of an embodiment of a plasma system 172 for tuning the parameter 110. A plasma chamber 109 includes a lower electrode 196, an upper electrode 194, and other parts (not shown), e.g., an upper dielectric ring surrounding the upper electrode 194, an upper electrode extension surrounding the upper dielectric ring, a lower dielectric ring surrounding the lower electrode 196, a lower electrode extension surrounding the lower dielectric ring, an upper plasma exclusion zone (PEZ) ring, a lower PEZ ring, etc. The upper electrode 194 is located opposite to and facing the lower electrode 196. A substrate 130, e.g., a semiconductor wafer, a semiconductor wafer with electrical components, etc., is supported on an upper surface 197 of the lower electrode 196. The lower electrode 196 is made of a metal, e.g., anodized aluminum, alloy of aluminum, etc. Also, the upper electrode 194 is made of a metal, e.g., aluminum, alloy of aluminum, etc.

Integrated circuits, e.g., application specific integrated circuit (ASIC), programmable logic device (PLD), etc. are developed on the substrate 132 and the integrated circuits are used in a variety of electronic devices, e.g., cell phones, tablets, smart phones, computers, laptops, networking equipment, etc. The integrated circuits are made up of the electrical components, e.g., transistors, resistors, capacitors, logic gates, storage devices, processors, etc.

In one embodiment, the upper electrode 194 includes a hole that is coupled to a central gas feed (not shown). The central gas feed receives one or more process gases from a gas supply (not shown). Examples of a process gases include an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc. The upper electrode 194 is grounded. The lower electrode 196 is coupled to a MHz RF generator 174, e.g., the A MHz RF generator, via an impedance matching circuit 192.

When the process gas is supplied between the upper electrode 194 and the lower electrode 196 and when a DAS 186 of the RF generator 174 generates and supplies power via the impedance matching circuit 192 to the lower electrode 196, the process gas is ignited to generate pulsed plasma 102 within the plasma chamber 109. For example, the DAS 186 generates and supplies power via the impedance matching circuit 192 to ignite the process gas to generate plasma 102. The plasma 102 is pulsed when an RF signal supplied to the lower electrode 196 changes between two states, S1 and S0, as described below.

An impedance matching circuit includes electrical components, e.g., electrical circuit components, inductors, capacitors, etc., to match an impedance of a power source coupled to the impedance matching circuit with an impedance of a load coupled to the impedance matching circuit. For example, the impedance matching circuit 192 matches an impedance of one or more portions, e.g., the DAS 186, etc., of the RF generator 174 and/or the transmission line 108 with an impedance of one or more portions, e.g., plasma 102, parts, etc. of the plasma chamber 109. The RF generator 174, the transmission line 108, or a combination thereof are examples of a source and the plasma chamber 109 is an example of a load. An impedance match between a source and a load reduces chances of power being reflected from the load towards the source.

A host system 190 is coupled to a digital signal processor (DSP) 180. The host system 190 generates and provides a digital pulsing signal 185 having two or more states to the DSP 180. Examples of the host system 190 include a processor, a computer, a controller, etc. In one embodiment, the digital pulsing signal 185 is a transistor-transistor logic (TTL) signal. Examples of the states include an on state and an off state, a state having a digital value of 1 and a state having a digital value of 0, a high state and a low state, etc.

In another embodiment, instead of the host system 190, a clock oscillator, e.g., a crystal oscillator, is used to generate an analog clock signal, which is converted by an analog-to-digital converter into a digital signal similar to the digital pulsing signal 185.

The digital pulsing signal 185 is sent to the DSP 180. The DSP 180 receives the digital pulsing signal 185 and identifies the states of the digital pulsing signal 185. For example, the DSP 180 determines that the digital pulsing signal 185 has a first magnitude, e.g., the value of 1, the high state magnitude, etc., during a first set of time periods and has a second magnitude, e.g., the value of 0, the low state magnitude, etc., during a second set of time periods. The DSP 180 determines that the digital pulsing signal 185 has the state S1 during the first set of time periods and has the state S0 during the second set of time periods. Examples of the state S0 include the low state, the state having the value of 0, and the off state. Examples of the state S1 include the high state, the state having the value of 1, and the on state. As yet another example, the DSP 180 compares a magnitude of the digital pulsing signal 185 with a pre-stored value to determine that the magnitude of the digital pulsing signal 185 is greater than the pre-stored value during the first set of time periods and that the magnitude of the digital pulsing signal 185 is not greater than the pre-stored value during the second set of time periods. In the embodiment in which the clock oscillator is used, the DSP 180 receives an analog clock signal from the clock oscillator, converts the analog signal into a digital form, and then identifies the two states S0 and S1.

In some embodiments, instead of identifying the states of the digital pulsing signal 185, states of plasma impedance are identified based on the variable 106. For example, a sensor 188 measures the information on a transmission line 108 and provides the information to the DSP 180. The DSP 180 calculates the variable 106 based on the information received from the sensor 188. If a value of the variable 106 exceeds a pre-stored value, the state of plasma 102 is S1 and if the value of the variable 106 does not exceed the pre-stored value, the state of plasma 102 is S0.

When a state is identified as S1, the DSP 180 provides a power value P1 and/or a frequency value F1 to a parameter control 176. Moreover, when the state is identified as S0, the DSP 180 provides a power value P0 and/or a frequency value F0 to a parameter control 178. An example of a parameter control that is used to tune a frequency includes an auto frequency tuner (AFT).

It should be noted that the parameter control 176, the parameter control 178, and the DSP 180 are portions of a control system 187. For example, the parameter control 176 and the parameter control 178 are logic blocks, e.g., tuning loops, which are portions of a computer program that is executed by the DSP 180. In some embodiments, the computer program is embodied within a non-transitory computer-readable medium, e.g., a storage device. Examples of a storage device include a read-only memory (ROM), a random access memory (RAM), or a combination thereof. To illustrate, a storage device includes a hard disk, a Flash memory, a redundant array of independent disks, etc.

In an embodiment, a controller, e.g., hardware controller, ASIC, PLD, etc., is used instead of a parameter control. For example, a controller is used instead of the parameter control 176 and another controller is used instead of the parameter control 178.

Upon receiving the power value P1 and/or the frequency value F1, the parameter control 176 provides the power value P1 and/or the frequency value F1 to a driver 182 of the DAS 186. Examples of a driver includes a power driver, a current driver, a voltage driver, a transistor, etc. The driver 182 generates an RF signal having the power value P1 and/or the frequency value F1 and provides the RF signal to an amplifier 184 of the DAS 186.

In one embodiment, the driver 182 generates an RF signal having a drive power value that is a function of the power value P1 and/or having a drive frequency value that is a function of the frequency value F1. For example, the drive power value is within a few, e.g. 1 thru 5, watts of the power value P1 and the drive frequency value is within a few, e.g. 1 thru 5, Hz of the frequency value F1.

The amplifier 184 amplifies the RF signal having the power value P1 and/or the frequency value F1 and generates an RF signal 120 that corresponds to the RF signal received from the driver 182. For example, the RF signal 120 has a higher amount of power than that of the power value P1. As another example, the RF signal 120 has the same amount of power as that of the power value P1. The RF signal 120 is transferred via the transmission line 108 and the matching circuit 192 to the lower electrode 196 to control impedance of plasma 102.

When the power value P1 and/or the frequency value F1 are provided to the DAS 186 by the parameter control 176 and the RF signal 120 is generated, the sensor 188 senses information on the transmission line 108. The sensor 188 sends the information to the control system 187, which converts the information from an analog form to a digital form. The control system 187 receives the information from the sensor 188 during the state S1 and provides the information to the host system 190. The host system 190 receives the information from the sensor 188 during the state S1 and executes the method 129 (FIG. 2), the method 136 (FIG. 3), and/or the method 150 (FIG. 4). For example, a processor of the host system 190 executes a variable stability routine 181 (VSR), e.g., the method 129, method 136, method 150, etc., upon receiving the measured information during the state S1.

Similarly, upon receiving the power value P0 and/or the frequency value F0, the parameter control 178 provides the power value P0 and/or the frequency value F0 to the driver 182. The driver 182 creates an RF signal having the power value P0 and/or the frequency value F0 and provides the RF signal to the amplifier 184.

In one embodiment, the driver 182 generates an RF signal having a drive power value that is a function of the power value P0 and/or having a drive frequency value that is a function of the frequency value F0. For example, the drive power value is within a few, e.g. 1 thru 5, watts of the power value P0 and the drive frequency value is within a few, e.g. 1 thru 5, Hz of the frequency value F0.

The amplifier 184 amplifies the RF signal having the power value P0 and/or the frequency value F0 and generates an RF signal 121 that corresponds to the RF signal received from the driver 182. For example, the RF signal 121 has a higher amount of power than that of the power value P0. As another example, the RF signal 121 has the same amount of power as that of the power value P0. The RF signal 121 is transferred via the transmission line 108 and the matching circuit 192 to the lower electrode 196 to control impedance of plasma 102.

When the power value P0 and/or the frequency value F0 are provided to the DAS 186 by the parameter control 178 and the RF signal 121 is generated, the sensor 188 senses information on the transmission line 108. The sensor 188 sends the information to the control system 187, which converts the information from an analog form to a digital form. The control system 187 receives the information from the sensor 188 during the state S0 and executes the method 129 (FIG. 2), the method 136 (FIG. 3), or the method 150 (FIG. 4). It should be noted that the methods 129, 136, and 150 are executed during a state, which is either of the digital pulsing signal 185 or the plasma 102. For example, a processor of the host system 190 executes the VSR 181 upon receiving the measured information during the state S0.

It should be noted that in one embodiment, the values P1, P0, F1, and F0 are determined in response to execution of the method 129, 136, or 150.

The host system 190 provides a value of the parameter 110 (FIG. 1) to a motor system 191, which includes one or more electric motors, which convert electrical energy into mechanical energy. The motor system 191 operates, e.g., move, etc., electrical components within the impedance matching circuit 192 to achieve the value of the parameter 110. For example, the motor system 191 moves plates of a capacitor to achieve a capacitance of the capacitor. As another example, the motor system 191 moves an iron core within an inductor of the impedance matching circuit 192 to achieve an inductance of the inductor. In some embodiments, instead of using the motor system 191 to change an inductance of the inductor of the impedance matching circuit, the host system 190 is used to change an amount of current supplied to an inductor of the impedance matching circuit 192 to achieve an inductance of the inductor. The host system 190 controls the impedance matching circuit 192 via the RF generator 174 to operate at a frequency, e.g., a radio frequency, which is an example of the parameter 110.

It should be noted that although the methods 129, 136, and 150 are described with reference to the A MHz RF generator, in various embodiments, the methods 129, 136, and 150 apply to any number, e.g., two or three, of RF generators. For example, a plasma system may include a 2 MHz RF generator, a 27 MHz RF generator, and a 60 MHz RF generator. In this example, in some embodiments, other frequencies, e.g., 3 MHz, 30 MHz, and 65 MHz, of the RF generators may be used. For example, a plasma system may include a 3 MHz RF generator, a 30 MHz RF generator, and a 65 MHz RF generator. Also, the numbers 2, 27, and 60 are not limited to 2, 27, and 60. For example, the 2 MHz RF generator generates an RF signal having a frequency ranging from 1.8 MHz to 2.2 MHz.

It should further be noted that although the sensor 188 is coupled to an output 189 of the RF generator 174, in several embodiments, a sensor, e.g., the sensor 188, another sensor, etc. may be coupled to an input 193 of the impedance matching circuit 192. The sensor that is coupled to the input 193 measures voltage and current at the input 193 and the voltage and current are used to determine source impedance at the input 193. The other sensor that is coupled to the input 193 provides measured information to the control system 187, which sends the information to the host system 190 for execution of the method 129, 136, or 150.

Figure 6:
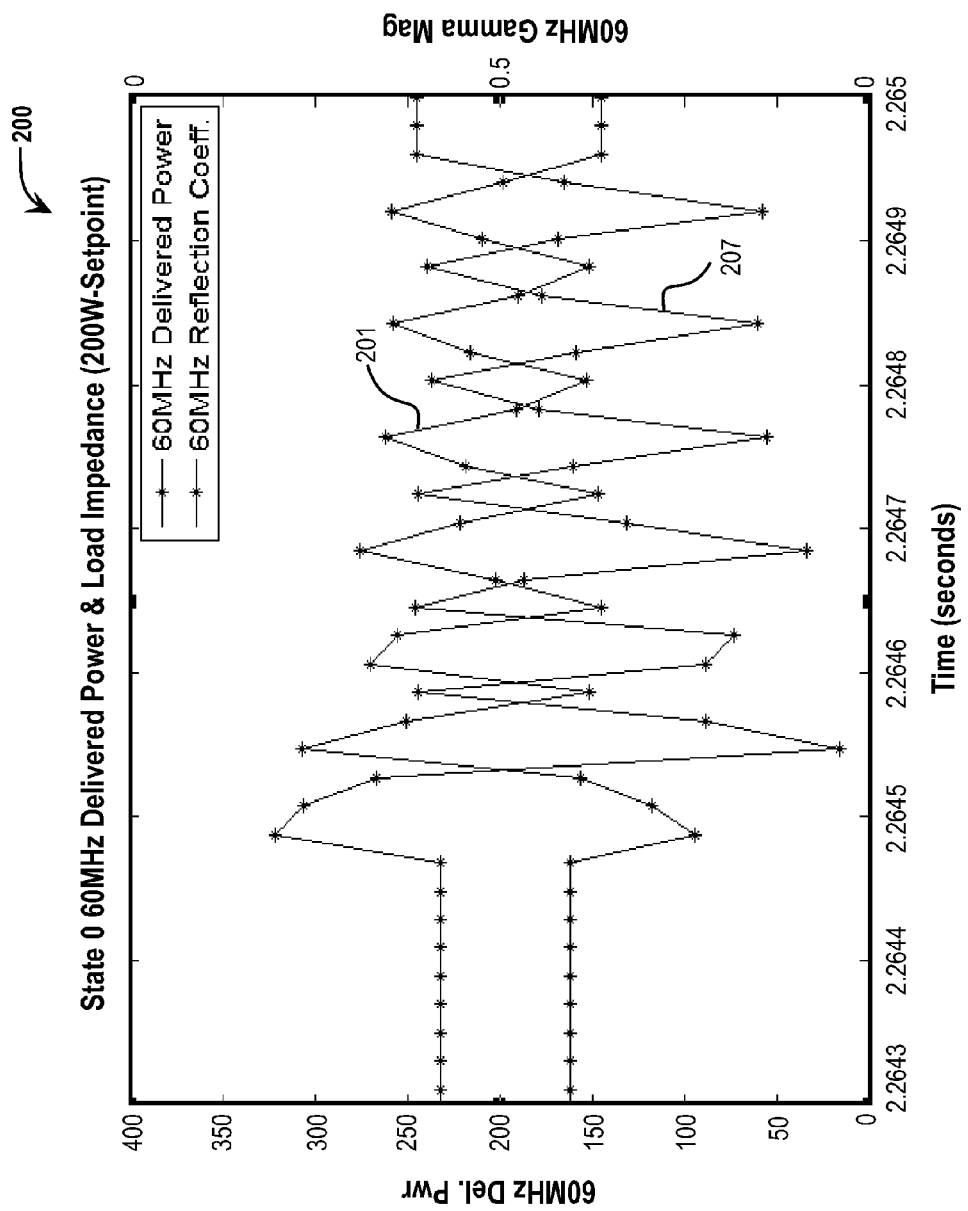
FIG. 6 is a graph illustrating that a reflection coefficient changes when power delivered to a plasma chamber changes, in accordance with an embodiment described in the present disclosure.

FIG. 6 is an embodiment of a graph 200 illustrating that a reflection coefficient 207 changes when delivered power 201 changes. The graph 200 plots the delivered power 201 on a y-axis versus time on an x-axis. The graph 200 also plots the reflection coefficient 207 on the y-axis versus time on the x-axis. As shown, the reflected coefficient 207 can be controlled by changing the delivered power 201.

Figure 7:
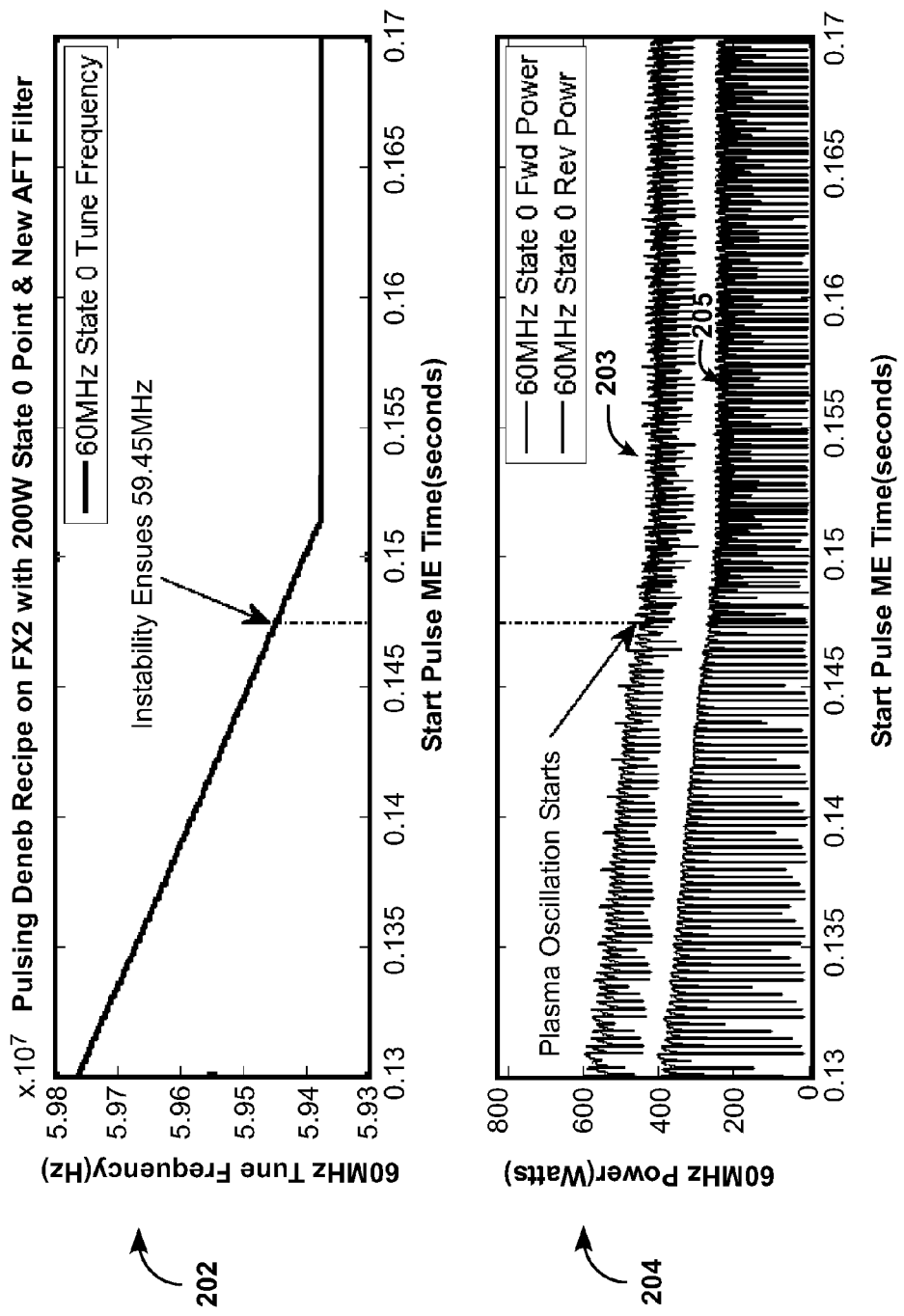
FIG. 7 shows graphs to illustrate that instability in a variable is a function of a change in values of the parameter, in accordance with an embodiment described in the present disclosure.

FIG. 7 is a diagram of embodiments of graphs 202 and 204 to illustrate that instability in the variable 106 is a function of a change in values of the parameter 110 and that the variable 106 may be controlled by tuning the parameter 110. The graph 202 plots frequency of an RF signal on a y-axis versus time for a state, e.g., the state S0, on an x-axis and the graph 204 plots power of the RF signal on a y-axis versus time for the state on an x-axis. As shown in graph 202, the frequency achieves a value, e.g., 59.45 MHz. When the frequency is at the value shown in graph 202, instability occurs in the variable 106. The instability is also shown in forward power 203 and in reflected power 205 in the graph 204. As shown, the frequency can be controlled to control stability of the variable 106.

Figure 8:
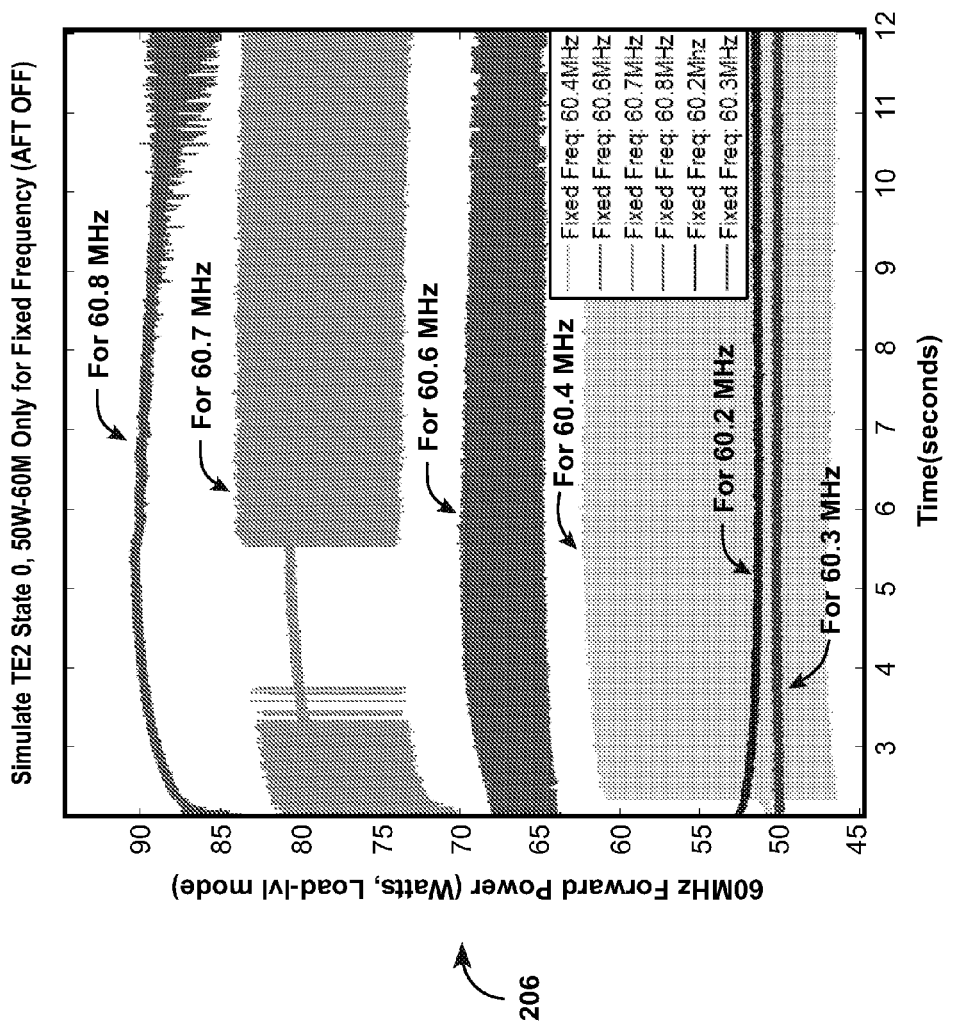
FIG. 8 is a graph to illustrate that instability in a variable may be controlled with a decrease in frequency of a radio frequency (RF) signal, in accordance with one embodiment described in the present disclosure.

FIG. 8 is an embodiment of a graph 206 to illustrate that instability in the variable 106 increases with an increase in frequency of an RF signal. The graph 206 plots forward power within an RF signal supplied to the plasma 102 (FIG. 5) on a y-axis versus time on an x-axis for various tune frequencies of the RF signal. As the tune frequencies increase from 60.2 MHz to 60.8 MHz, instability in the variable 106 increases. The instability in the variable 106 is decreased by decreasing the frequencies. The instability in the variable 106 is illustrated by instability in the forward power.

Figure 9:
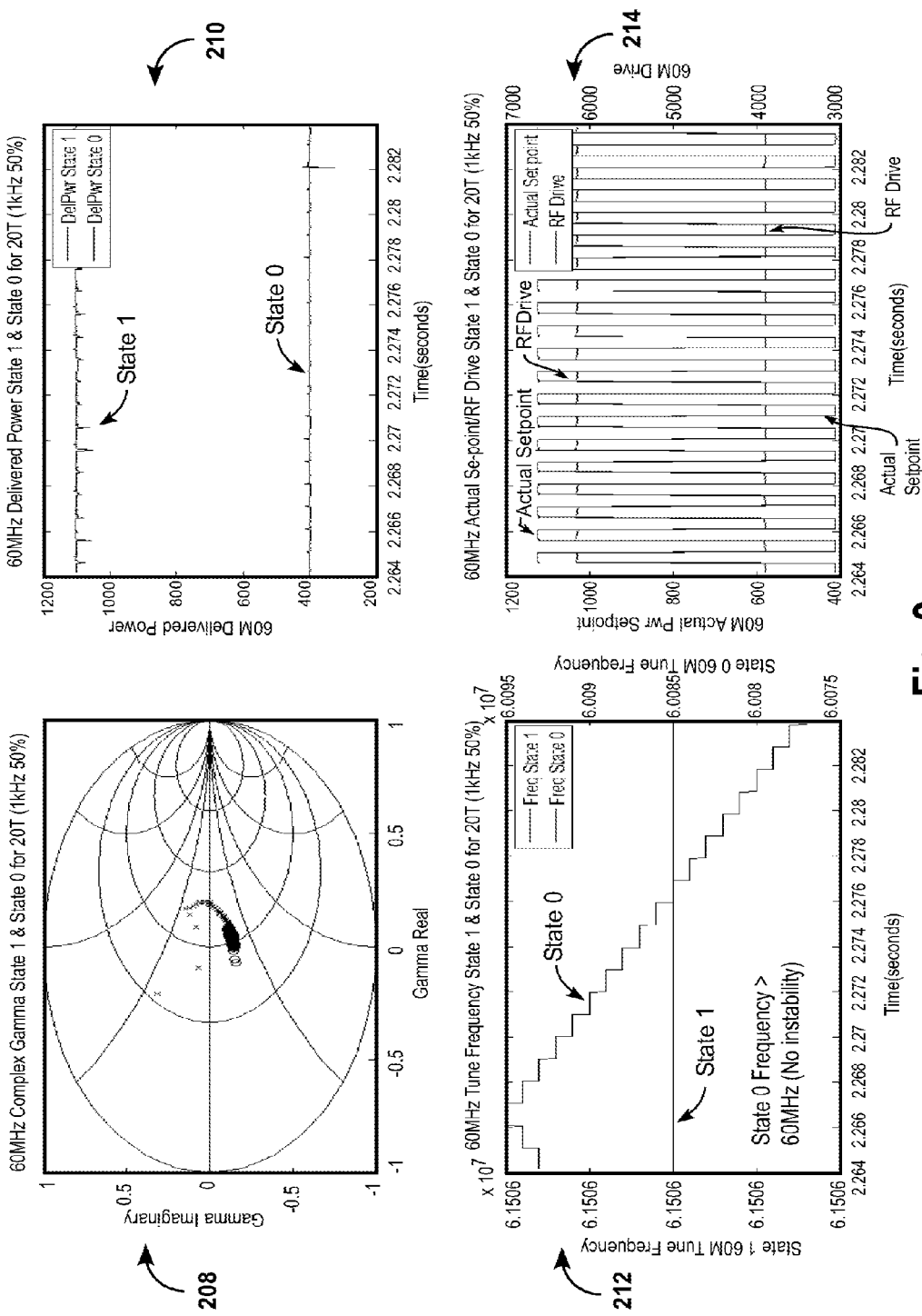
FIG. 9 shows graphs to illustrate that gamma may be controlled when power and/or frequency of an RF signal is tuned, in accordance with an embodiment described in the present disclosure.
Figure 10:
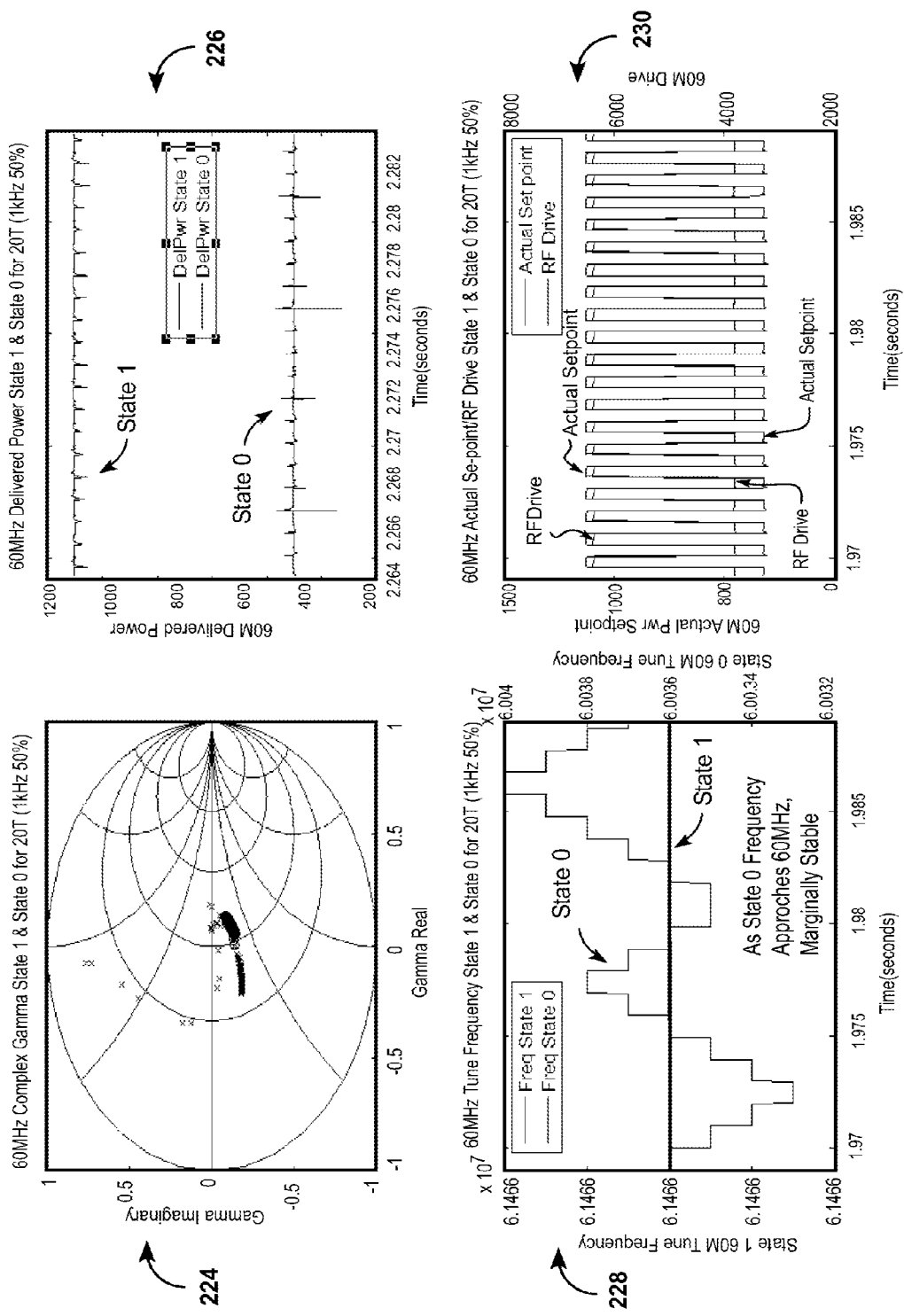
FIG. 10 shows graphs to illustrate that gamma may be controlled when power and/or frequency of an RF signal is tuned, in accordance with an embodiment described in the present disclosure.
Figure 11:
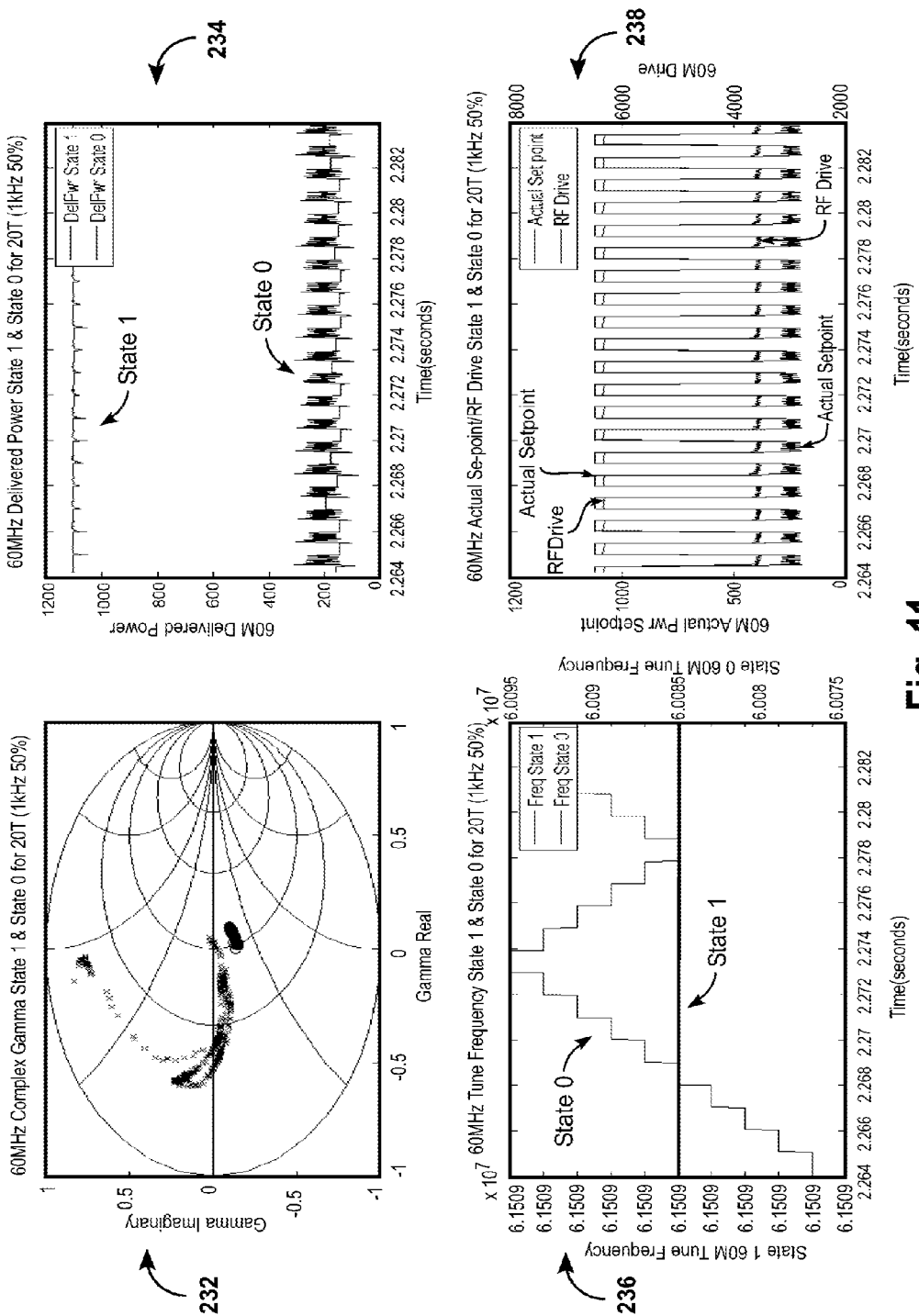
FIG. 11 shows graphs to illustrate that gamma may be controlled when power and/or frequency of an RF signal is tuned, in accordance with one embodiment described in the present disclosure.

FIGS. 9-11 are embodiments of graphs 208, 210, 212, 214, 224, 226, 228, 230, 232, 234, 236, and 238 to illustrate that gamma may be controlled when power and/or frequency of an RF signal is tuned. Each graph 208, 224, and 232 plots an imaginary part of gamma on a y-axis versus a real part of gamma on an x-axis. Moreover, each graph 210, 226, and 234 plots delivered power of an RF signal on a y-axis versus time on an x-axis during states S1 and S0. It should be noted that in an embodiment, the terms state S1 and state 1 are used interchangeably herein and the terms state S0 and state 0 are used interchangeably.

Each graph 212, 228, and 236 plots a frequency of an RF signal on a y-axis versus time on an x-axis. Also, each graph 214, 230, and 238 plots actual power setpoints and RF drive power on a y-axis versus time on an x-axis. As shown by graphs 208, 224, and 232, variation in gamma increases in the order of the graphs. For example, gamma that is plotted in graph 208 varies less than gamma that is plotted in graph 224, and gamma that is plotted in the graph 224 varies less than gamma that is plotted in the graph 232.

The gamma that is plotted in the graph 208 is controlled using delivered power during each state 1 and state 0. The delivered power is shown in the graph 210. Moreover, the gamma that is plotted in the graph 208 is controlled using tune frequency during each state 1 and state 0. The tune frequency is shown in the graph 212.

Similarly, the gamma that is plotted in the graph 224 is controlled using delivered power during each state 1 and state 0. The delivered power is shown in the graph 226. Moreover, the gamma that is plotted in the graph 224 is controlled using tune frequency during each state 1 and state 0. The tune frequency is shown in the graph 228.

Also, the gamma that is plotted in the graph 232 is controlled using delivered power during each state 1 and state 0. The delivered power is shown in the graph 234. Moreover, the gamma that is plotted in the graph 232 is controlled using tune frequency during each state 1 and state 0. The tune frequency is shown in the graph 236.

Figure 12:
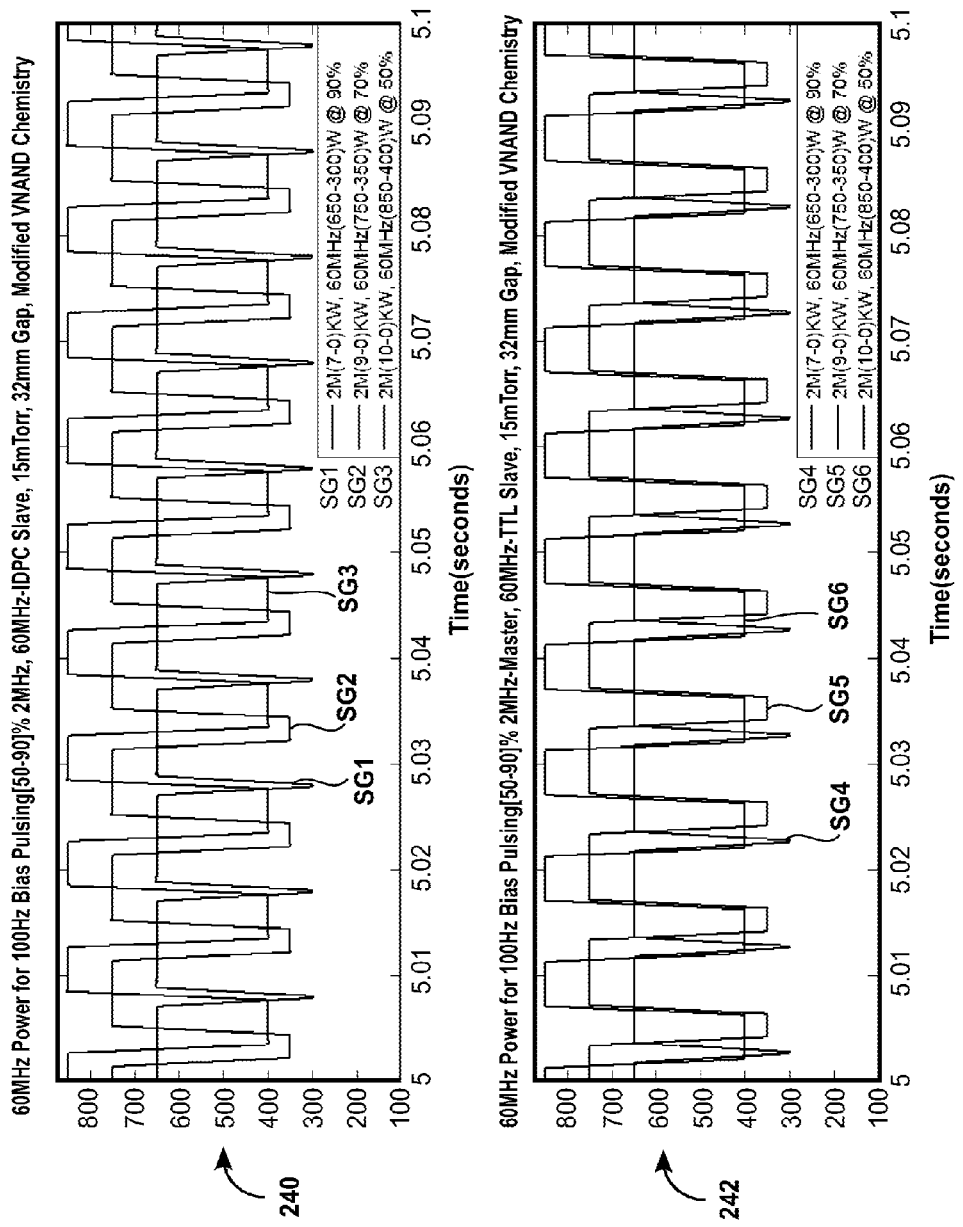
FIG. 12 shows graphs to illustrate that delivered power at which a local minima is achieved can be repeatedly controlled, in accordance with one embodiment described in the present disclosure.

FIG. 12 shows embodiments of graphs 240 and 242 to illustrate that delivered power at which a local minima is achieved can be repeatedly controlled. The repeatability allows control of the process performed on the substrate 130 (FIG. 5). The graph 240 plots delivered power signals SG1, SG2, and SG3 versus time and the graph 242 also plots delivered power signals SG4, SG5, and SG6 versus time.

Figure 13:
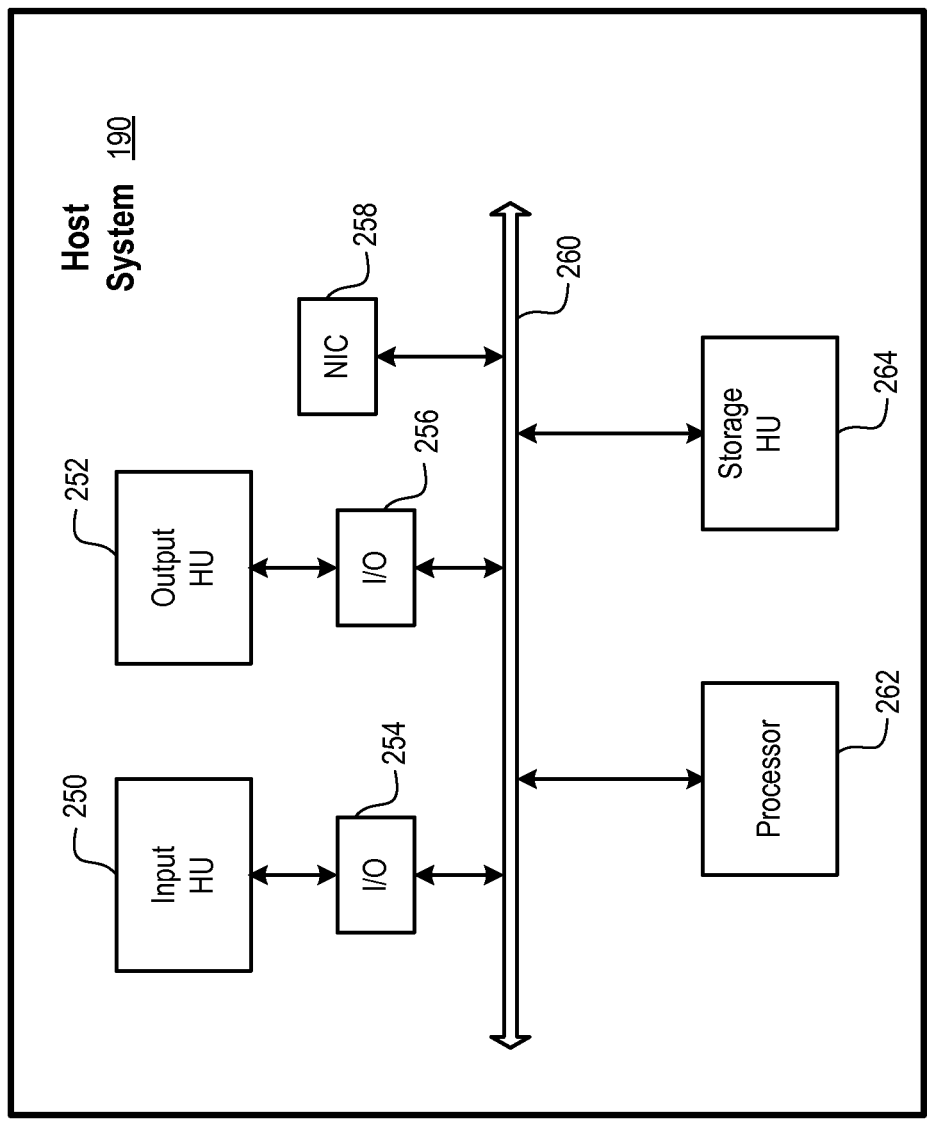
FIG. 13 is a block diagram of a host system of the system of FIG. 5, in accordance with an embodiment described in the present disclosure.

FIG. 13 is a block diagram of an embodiment of the host system 190 (FIG. 5). The host system 190 includes an input hardware unit (HU) 250, an output HU 252, an input/output (I/O) interface 254, an I/O interface 256, a network interface controller (NIC) 258, a bus 260, a processor 262, and a storage HU 264. The processor 262, the storage HU 264, the input HU 250, the output HU 252, the I/O interface 254, the I/O interface 256, and the NIC 258 are coupled with each other via the bus 260 Examples of the input HU 250 include a mouse, a keyboard, a stylus, etc. Examples of the output HU 252 include a display, a speaker, or a combination thereof. The display may be a liquid crystal display, a light emitting diode display, a cathode ray tube, a plasma display, etc. Examples of the NIC 258 include a network interface card, a network adapter, etc. Examples of the storage HU include a storage device, a ROM, a RAM, or a combination thereof. For example, the storage HU may be a Flash drive, a redundant array of storage disks, a hard disk, etc.

Examples of an I/O interface include an interface that provides compatibility between pieces of hardware coupled to the interface. For example, the I/O interface 254 converts a signal received from the input HU 250 into a form, amplitude, and/or speed compatible with the bus 260. As another example, the I/O interface 256 converts a signal received from the bus 260 into a form, amplitude, and/or speed compatible with the output HU 252.

It should be noted that although the above-described embodiments relate to providing an RF signal to the lower electrode 196 and grounding the upper electrode 194, in several embodiments, the RF signal is provided to the upper electrode 194 while the lower electrode 196 is grounded.

It should further be noted that although the above-described embodiments are described with reference to parallel plate plasma chamber, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the A MHz RF generator is coupled to an inductor within the ICP plasma chamber.

Embodiments described herein may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

One or more embodiments can also be fabricated as computer-readable code on a computer-readable medium. The computer-readable medium is any data storage HU that can store data, which can be thereafter be read by a computer system. Examples of the computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage devices. The computer-readable medium can include computer-readable tangible medium distributed over a network-coupled computer system so that the computer-readable code is stored and executed in a distributed fashion.

It should be noted that one or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A method for tuning a parameter associated with plasma impedance, comprising:
receiving information to determine a variable, the information measured at a transmission line, the information measured when the parameter has a first value, the transmission line used to provide power to a plasma chamber via an impedance matching circuit;
determining whether the variable is at a local minima;
providing the first value to generate a radio frequency (RF) signal upon determining that the variable is at the local minima, the RF signal corresponding to the first value, the RF signal to be sent to the plasma chamber;
changing the first value to a second value of the parameter upon determining that the variable is not at the local minima; and
determining whether the variable is at a local minima when the parameter has the second value,
wherein the method is executed by a processor.

2. The method of claim 1, wherein said determining whether the variable is at a local minima when the parameter has a first value comprises:
determining whether the variable exceeds a threshold when the parameter has the first value; or
determining whether the variable is stable when the parameter has the first value; or
a combination thereof.

3. The method of claim 1, wherein the information includes voltage, current, power, or a combination thereof, wherein the variable includes gamma, reflected power, complex voltage reflection coefficient, plasma impedance, or a combination thereof.

4. A method for tuning a parameter associated with plasma impedance, comprising:
receiving information to determine a variable, the information measured at a transmission line, the information measured when the parameter has a first value, the transmission line used to provide power to a plasma chamber via an impedance matching circuit;
determining whether the variable is at a local minima when the parameter has the first value;
determining whether the first value of the parameter is within a limit of a learned value upon determining that the variable is at the local minima, the learned value determined during a learning routine;
providing the learned value to generate a radio frequency (RF) signal or to tune the impedance matching circuit upon determining that the first value of the parameter is within the limit; and
changing the first value to a second value of the parameter upon determining that the parameter has the first value that is outside the limit,
wherein the method is executed by a processor.

5. The method of claim 4, wherein said determining whether the variable is at a local minima when the parameter has a first value comprises:
determining whether the variable exceeds a threshold when the parameter has the first value; and
determining whether the variable is stable when the parameter has the first value.

6. The method of claim 5, wherein the variable is unstable when the variable oscillates between a minimum value and a maximum value, and a range between the minimum value and the maximum value exceeds a predetermined range.

7. The method of claim 6, wherein the variable is stable when the variable lacks oscillation.

8. The method of claim 5, wherein the method is executed during processing of a substrate.

9. The method of claim 8, wherein the substrate is implemented within an electronic device.

10. A method for tuning a parameter associated with plasma impedance, comprising:
receiving information to determine a variable, the information measured at a transmission line, the information measured when the parameter has a first value, the transmission line used to provide power to a plasma chamber via an impedance matching circuit;
determining a local minima of the variable, the local minima achieved when the parameter has the first value;
tuning the parameter by changing the first value to one or more other values of the parameter;

determining a number of events for which the variable is unstable when the parameter has the one or more other values;

determining whether the number of events exceeds a boundary;

reversing a direction of tuning the parameter upon determining that the number of events exceeds the boundary; and discontinuing further tuning of the parameter upon determining that the number of events does not exceed the boundary, wherein the method is executed by a processor.

11. The method of claim 10, wherein said determining the local minima of the variable comprises:

determining that the variable does not exceed a threshold when the parameter has the first value; and determining that the variable is stable when the parameter has the first value.

12. The method of claim 10, wherein said reversing the direction of tuning the parameter includes increasing a value of the parameter or decreasing a value of the parameter.

13. The method of claim 10, wherein the method is executed during processing of a substrate, wherein the method is performed without knowledge of a learned value of the parameter, wherein the local minima is other than an absolute minima, wherein the processor is within a host system, the host system coupled to a radio frequency (RF) generator, the RF generator coupled to the plasma chamber via the impedance matching circuit.

14. The method of claim 10, wherein the method is executed during processing of a substrate, wherein the substrate is implemented within an electronic device.

* * * * *